United States Patent
Kim et al.

(10) Patent No.: US 11,309,376 B2
(45) Date of Patent: Apr. 19, 2022

(54) DISPLAY DEVICE

(71) Applicant: LG Display Co., Ltd., Seoul (KR)

(72) Inventors: DongYoon Kim, Paju-si (KR); JaeSung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 201 days.

(21) Appl. No.: 16/714,152

(22) Filed: Dec. 13, 2019

(65) Prior Publication Data
US 2020/0212132 A1 Jul. 2, 2020

(30) Foreign Application Priority Data
Dec. 27, 2018 (KR) .................. 10-2018-0171109

(51) Int. Cl.
| | |
|---|---|
| H01L 27/32 | (2006.01) |
| H01L 51/52 | (2006.01) |
| H01L 51/00 | (2006.01) |
| G09G 3/00 | (2006.01) |
| G09G 3/32 | (2016.01) |
| G09F 9/30 | (2006.01) |

(52) U.S. Cl.
CPC ......... *H01L 27/3276* (2013.01); *G09G 3/035* (2020.08); *G09G 3/32* (2013.01); *H01L 27/3223* (2013.01); *H01L 27/3225* (2013.01); *H01L 27/3258* (2013.01); *H01L 51/0031* (2013.01); *H01L 51/0097* (2013.01); *H01L 51/524* (2013.01); *H01L 51/5253* (2013.01); *H01L 51/5281* (2013.01); *G09F 9/301* (2013.01); *G09G 2380/02* (2013.01); *H01L 2251/5338* (2013.01)

(58) Field of Classification Search
CPC ............ H01L 27/3276; H01L 27/3223; H01L 27/3258; H01L 51/0097; H01L 2251/5338; H01L 27/3225; H01L 51/0031; G09G 3/035
See application file for complete search history.

(56) References Cited

U.S. PATENT DOCUMENTS

| | | |
|---|---|---|
| 10,210,782 B2 | 2/2019 | Lee et al. |
| 2016/0322451 A1* | 11/2016 | Park .................. G09G 3/006 |
| 2018/0033354 A1 | 2/2018 | Lee et al. |
| 2018/0158741 A1 | 6/2018 | Kim et al. |
| 2018/0158894 A1* | 6/2018 | Park .................. H01L 27/3276 |
| 2018/0182274 A1 | 6/2018 | Jung et al. |
| 2019/0180663 A1 | 6/2019 | Lee et al. |

FOREIGN PATENT DOCUMENTS

| | | |
|---|---|---|
| KR | 10-2018-0014906 A | 2/2018 |
| KR | 10-2018-0064596 A | 6/2018 |
| KR | 10-2018-0065061 A | 6/2018 |
| KR | 10-2018-0076417 A | 7/2018 |

\* cited by examiner

*Primary Examiner* — Jose R Diaz
(74) *Attorney, Agent, or Firm* — Fenwick & West LLP

(57) ABSTRACT

A display device is disclosed that includes one or more crack detection units. The crack detection units can detect a crack position in the display device without requiring the disassembly of the display device. The crack detection units may be disposed across one or more non-active areas of the display device.

22 Claims, 13 Drawing Sheets

DISPLAY DEVICE

CROSS-REFERENCE TO RELATED APPLICATIONS

This application claims the priority of Republic of Korea Patent Application No. 10-2018-0171109 filed on Dec. 27, 2018, in the Korean Intellectual Property Office, the disclosure of which is incorporated herein by reference in its entirety.

BACKGROUND

Field

The present disclosure relates to a display device, and more particularly, to a rollable display device which can display an image even when rolled up.

Description of the Related Art

A display device used for a computer monitor, a TV, a mobile phone, etc. includes an organic light-emitting display (OLED) that emits light or a liquid-crystal display (LCD) that requires a separate light source.

As display devices have been increasingly applied to diverse fields such as a computer monitor, a TV, and a personal mobile device, display devices having a large display area and a reduced volume and weight have been studied.

Further, recently, a rollable display device in which a display part, lines, etc. are formed on a flexible substrate made of flexible plastic and which can display an image even when rolled up has attracted attention as a next-generation display device.

SUMMARY

An object to be achieved by the present disclosure is to provide a display device in which a crack position in the display device can be detected without disassembling the display device.

Another object to be achieved by the present disclosure is to provide a display device in which a crack sensing element is applied to a gate driving unit to detect a crack of the display device caused by winding and unwinding.

Yet another object to be achieved by the present disclosure is to provide a display device in which a crack detection loop is applied to a specific region of a display panel to accurately detect a crack position in the display device.

Objects of the present disclosure are not limited to the above-mentioned objects, and other objects, which are not mentioned above, can be clearly understood by those skilled in the art from the following descriptions.

According to an aspect of the present disclosure, a rollable display device is provided. The rollable display device includes: a substrate including an active area that displays an image, a first non-active area extended from the active area that does not display the image, a second non-active area extended from the first non-active area that does not display the image, and a third non-active area extended from the second non-active area that does not display the image; a planarization layer disposed in the active area and the first non-active area; a display element disposed on the planarization layer in the active area; an encapsulation substrate disposed on the display element in the active area, the first non-active area, and the second non-active area; and a plurality of crack detection units disposed in at least one of the first non-active area, the second non-active area, or the third non-active area. Thus, it is possible to detect an area where a crack occurs without disassembling the rollable display device.

According to another aspect of the present disclosure, a display device is provided. The display device includes: a substrate in which an active area that displays an image, a first non-active area surrounding the active area, a second non-active area surrounding the first non-active area, and a third non-active area surrounding the second non-active area; a planarization layer disposed on the substrate in the active area and the first non-active area without being disposed in the second non-active area and the third non-active area; a display element disposed on the planarization layer; an encapsulation substrate disposed on the display element, the encapsulation substrate in the active area, the first non-active area, and the second non-active area without being in the third non-active area; a roller unit configured to wind or unwind the substrate; and a plurality of crack detection units disposed on the substrate, the plurality of crack detection units configured to detect whether a crack occurs in at least one of the first non-active area, the second non-active area, or the third non-active area. Thus, it is possible to improve the processing yield of the display device.

In one embodiment a flexible display device comprises: a substrate including an active area that displays an image, a first non-active area extended from the active area that does not display the image, a second non-active area extended from the first non-active area that does not display the image, and a third non-active area extended from the second non-active area that does not display the image; a display element configured to display an image in the active area, the display element disposed in the active area without being disposed in the first non-active area, the second non-active area, and the third non-active area; a plurality of crack detection pads including a first crack detection pad and a second crack detection pad, the first crack detection pad and the second crack detection pad disposed in the third non-active area without being disposed in the active area, the second non-active area, and the third non-active area; and a first crack detection line having a first end and a second end, the first end connected to the first crack detection pad and the second end connected to the second crack detection pad, the first crack detection line disposed across at least one of the third non-active area, the second non-active area, or the third non-active area.

Other detailed matters of the exemplary embodiments are included in the detailed description and the drawings.

According to the present disclosure, it is possible to detect an area where a crack occurs without disassembling a display device. Thus, a crack inspection process can be simplified.

According to the present disclosure, it is possible to more precisely detect an area where a crack occurs. Thus, the processing yield of a display device can be improved.

According to the present disclosure, it is possible to detect an area where a crack occurs by using a gate driving unit. Thus, additional processes or costs for detecting the area where a crack occurs can be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
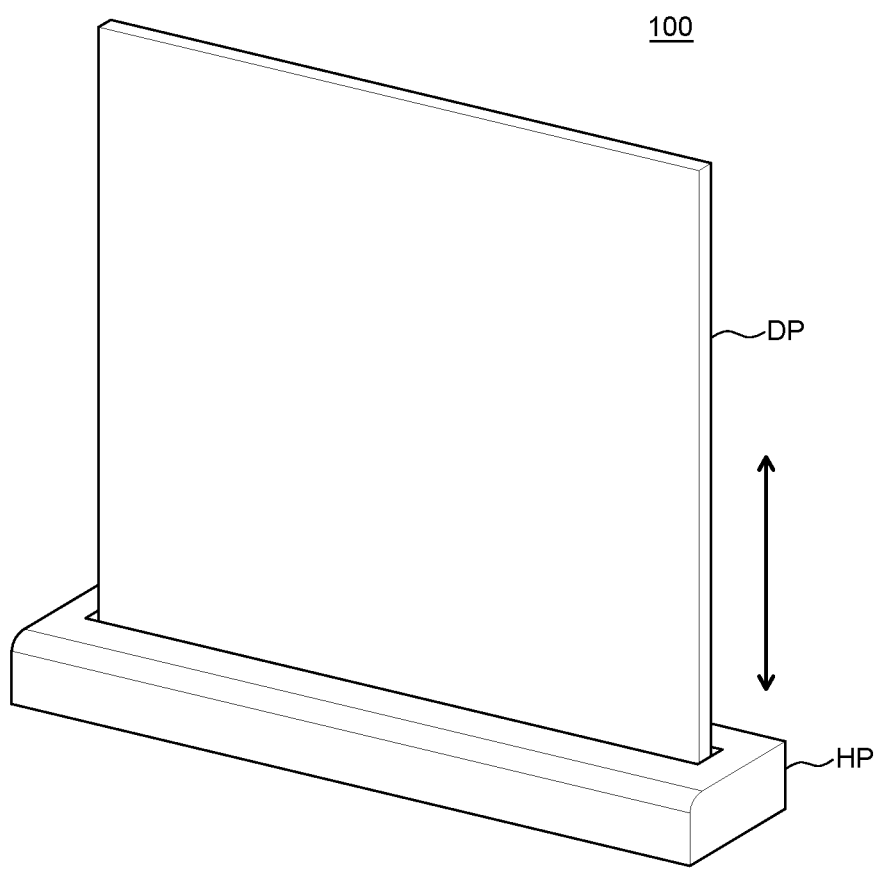
FIG. 1A and FIG. 1B are perspective views of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a rollable display device according to exemplary embodiments of the present disclosure will be described in detail with reference to accompanying drawings.

<Display Device-Rollable Display Device>

A rollable display device may refer to a display device which can display an image even when rolled up. The rollable display device may have higher flexibility than conventional typical display devices. The rollable display device can be freely changed in shape according to whether the rollable display device is used or not. Specifically, when the rollable display device is not used, the rollable display device can be housed as rolled up to reduce its volume. In contrast, when the rollable display device is used, the rolled rollable display device can be unrolled.

Figure 1B:
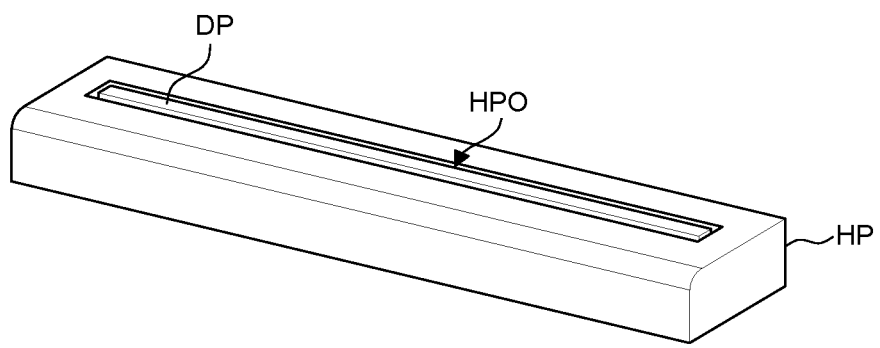

FIG. 1A and FIG. 1B are perspective views of a display device according to an embodiment of the present disclosure. Referring to FIG. 1A and FIG. 1B, a display device 100 according to an embodiment of the present disclosure includes a display part DP and a housing part HP.

The display part DP is configured to display images to a user. For example, display elements, circuits for driving the display elements, lines, other components, and the like may be disposed in the display part DP. Herein, the display device 100 according to an embodiment of the present disclosure is a rollable display device 100. Therefore, the display part DP may be configured to be wound and unwound. For example, the display part DP may include a display panel and a back cover which are flexible so as to be wound or unwound. More details of the display part DP will be described later with reference to FIG. 4 through FIG. 6.

The housing part HP serves as a case where the display part DP can be housed. The display part DP may be wound and then housed inside the housing part HP, and the display part DP may be unwound and then presented outside the housing part HP.

The housing part HP includes an opening HPO through which the display part DP can move in and out of the housing part HP. The display part DP can move up and down through the opening HPO of the housing part HP.

Meanwhile, the display part DP of the display device 100 can be converted from a full unwound state to a full wound state, and vice versa.

FIG. 1A shows a full unwound state of the display part DP of the display device 100. The full unwound state refers to a state where the display part DP of the display device 100 is presented outside the housing part HP. That is, the full unwound state can be defined as a state where the display part DP is unwound to a maximum so as not to be further unwound and presented outside the housing part HP in order for the user to watch images on the display device 100.

FIG. 1B shows a full wound state of the display part DP of the display device 100. The full wound state refers to a state where the display part DP of the display device 100 is housed inside the housing part HP and cannot be further wound. That is, the full wound state can be defined as a state where the display part DP is wound and housed inside the housing part HP when the user does not watch images on the display device 100 because the display part DP housed inside the housing part HP is desired for the sake of external appearance. Further, in the full wound state where the display part DP is housed inside the housing part HP, the display device 100 is reduced in volume and easy to transport.

Meanwhile, a moving part for winding or unwinding the display part DP to change the display part DP to the full unwound state or the full wound state is provided.

<Moving Part>

Figure 2:
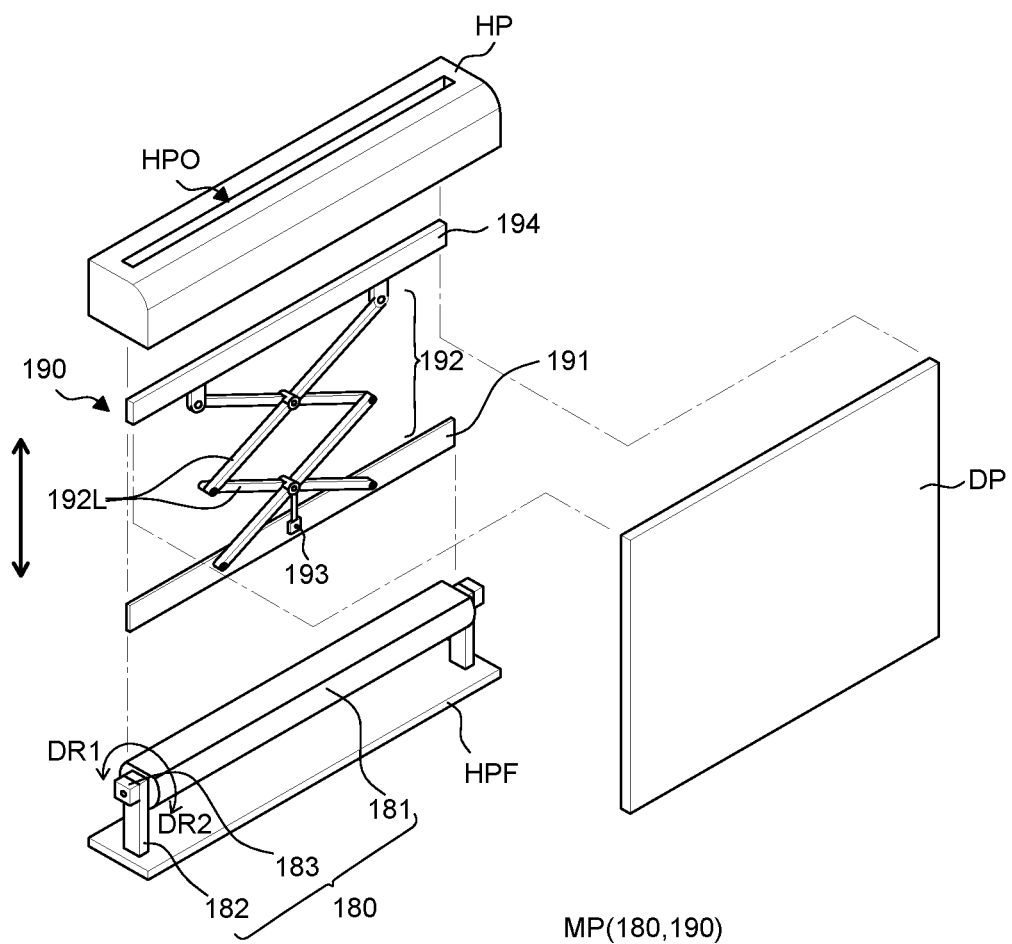
FIG. 2 is an exploded perspective view of the display device according to an embodiment of the present disclosure.
Figure 3:
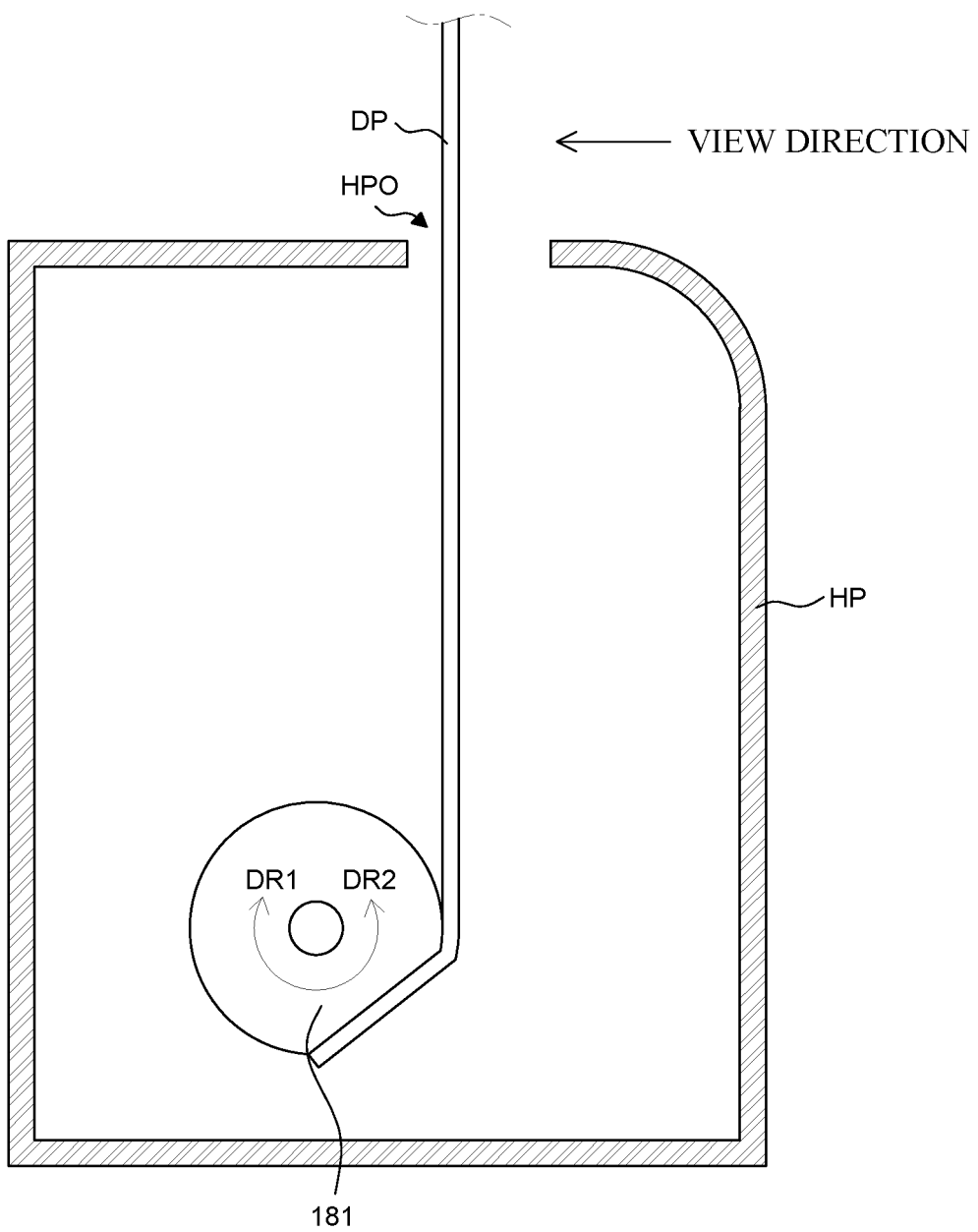
FIG. 3 is a schematic cross-sectional view provided to explain a head bar and a display part of the display device according to an embodiment of the present disclosure.

FIG. 2 is an exploded perspective view of the display device according to an embodiment of the present disclosure. FIG. 3 is a cross-sectional view of the display device according to an embodiment of the present disclosure. FIG. 3 is a schematic cross-sectional view provided to explain a roller 181 and the display part DP of the display device 100 according to an embodiment of the present disclosure. For convenience of description, FIG. 3 illustrates only the housing part HP, the roller 181, and the display part DP.

First, referring to FIG. 2, a moving part MP includes a roller unit 180 and an elevating unit 190.

The roller unit 180 may rotate in a first direction DR1 or a second direction DR2. The display part DP fixed to the roller unit 180 winds around or unwinds from the roller unit 180 as the roller unit 180 rotates. The roller unit 180 includes the roller 181, a roller supporting unit 182, and a roller rotating unit 183.

The roller 181 is a member around which the display part DP is wound. The lower edge of the display part DP may be fixed to the roller 181. When the roller 181 rotates, the display part DP whose lower edge is fixed to the roller 181 may be wound around the roller 181. On the contrary, when the roller 181 rotates in the opposite direction, the display part DP wound around the roller 181 may be unwound from the roller 181.

Referring to FIG. 3, the roller 181 may include at least a part of the outer peripheral surface having a flat surface and the other part having a curved surface. The roller 181 has a cylindrical shape overall but may be partially flat. That is, a part of the outer peripheral surface of the roller 181 is flat and the other part of the outer peripheral surface is curved. A plurality of flexible films 130 and a printed circuit board 140 of the display part DP may be mounted on the flat part of the roller 181. However, the roller 181 may be a completely cylindrical shape or may have any shape around which the display part DP can be wound, but is not limited thereto.

The roller supporting unit 182 supports the roller 181 from both sides of the roller 181. Specifically, the roller supporting units 182 are disposed on a bottom surface HPF of the housing part HP. Further, upper side surfaces of the respective roller supporting units 182 are combined with both ends of the roller 181. Thus, the roller supporting unit 182 may support the roller 181 so as to be spaced apart from the bottom surface HPF of the housing part HP. Herein, the roller 181 may be rotatably combined with the roller supporting unit 182.

The roller rotating unit 183 may rotate the roller 181 in the first direction DR1 or the second direction DR2. The roller rotating unit 183 may be disposed on each of the pair of roller supporting units 182. For example, the roller rotating unit 183 may be a rotary motor that transfers rotatory power to the roller 181, but is not limited thereto.

The elevating unit 190 moves the display part DP up and down according to driving of the roller unit 180. The elevating unit 190 includes a link supporting unit 191, a link unit 192, a link elevating unit 193, and the head bar 194.

The link supporting unit 191 supports the link unit 192 and the link elevating unit 193. Specifically, the link supporting unit 191 supports the link unit 192 which moves up and down so that the display part DP does not collide with the boundary of the opening HPO of the housing part HP. The link supporting unit 191 supports the link unit 192 and the display part DP to be movable only up and down but not forward and backward.

The link unit 192 includes a plurality of links 192L hinged to each other. The plurality of links 192L is rotatably hinged to each other and can be moved up and down by the link elevating unit 193. When the link unit 192 moves up and down, the plurality of links 192L may rotate in a direction to be farther from or closer to each other.

The link elevating unit 193 may move the link unit 192 up and down. The link elevating unit 193 may rotate the plurality of links 192L of the link unit 192 to be closer to or farther from each other. The link elevating unit 193 may move the link unit 192 up or down to move the display part DP connected to the link unit 192 up or down.

Herein, driving of the link elevating unit 193 is synchronized with driving of the roller rotating unit 183. Thus, the roller unit 180 and the elevating unit 190 may be driven at the same time. For example, when the display part DP is converted from the full unwound state to the full wound state, the roller unit 180 may be driven to wind the display part DP around the roller 181. At the same time, the elevating unit 190 may rotate the plurality of links 192L of the link unit 192 to move the display part DP down. Further, when the display part DP is converted from the full winding state to the full unwinding state, the roller unit 180 may be driven to unwind the display part DP from the roller 181. At the same time, the elevating unit 190 may rotate the plurality of links 192L of the link unit 192 to move the display part DP up.

The head bar 194 of the elevating unit 190 is fixed to the uppermost end of the display part DP. The head bar 194 is connected to the link unit 192 and may move the display part DP up and down according to rotation of the plurality of links 192L of the link unit 192. That is, the display part DP can be moved up and down by the head bar 194, the link unit 192, and the link elevating unit 193.

Hereafter, an operation of the moving part MP will be described in detail with reference to FIG. 3.

Referring to FIG. 3, the lower edge of the display part DP is connected to the roller 181. Further, when the roller 181 is rotated by the roller rotating unit 183 in the first direction DR1, i.e., in a clockwise direction, the display part DP may be wound around the roller 181 so that the rear surface of the display part DP can be closely contacted with a surface of the roller 181.

When the roller 181 is rotated by the roller rotating unit 183 in the second direction DR2, i.e., in a counterclockwise direction, the display part DP wound around the roller 181 may be unwound from the roller 181 and then presented outside the housing part HP.

In some embodiments, the moving part MP different in structure from the above-described moving part MP may also be applied to the display device 100. That is, the roller unit 180 and the elevating unit 190, as described above, may be changed in configuration as long as the display part DP can be wound and unwound. Some of their components may be omitted or other components may be added.

<Display Part>

Figure 4:
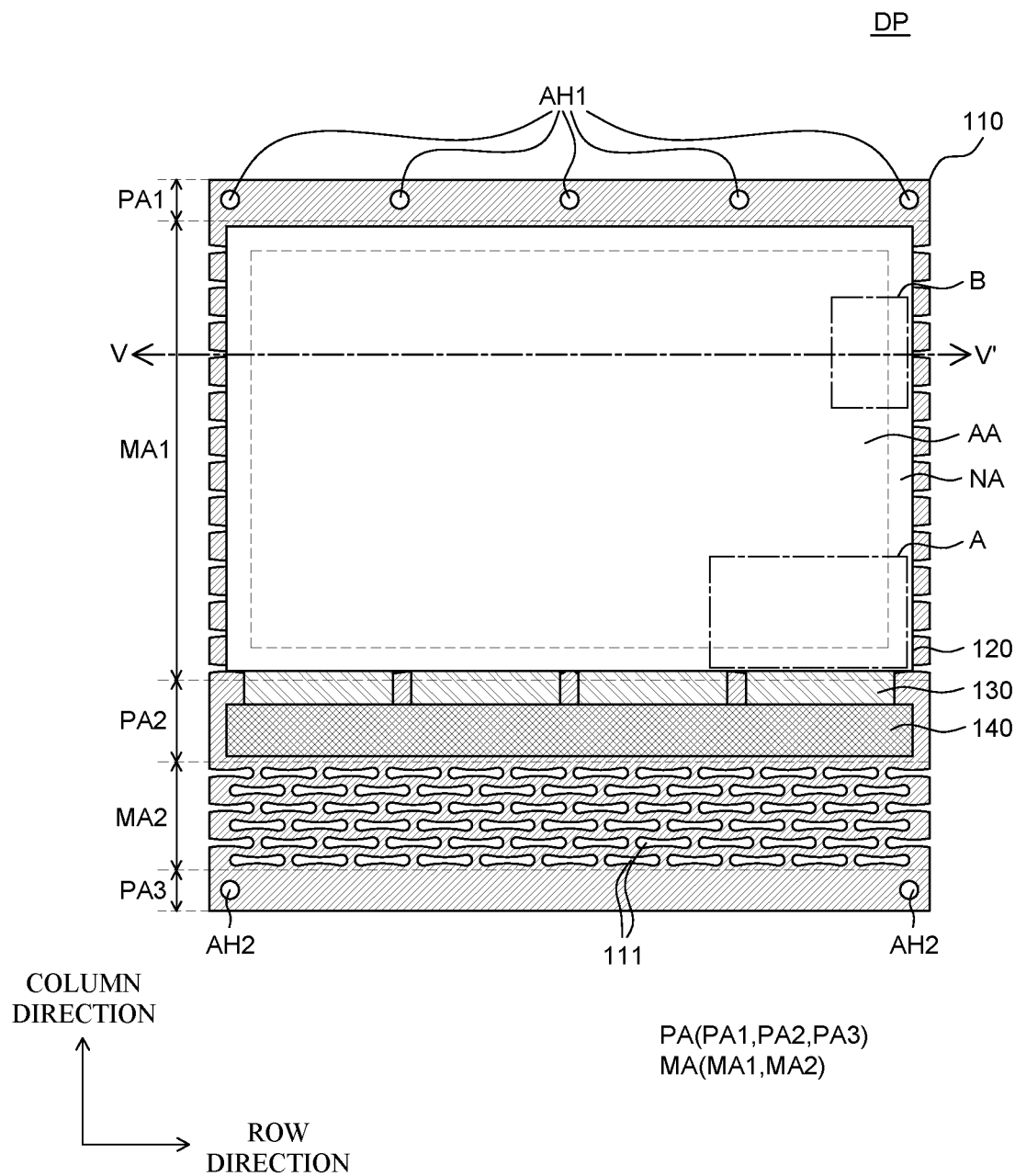
FIG. 4 is a plan view of the display part of the display device according to an embodiment of the present disclosure.
Figure 5:
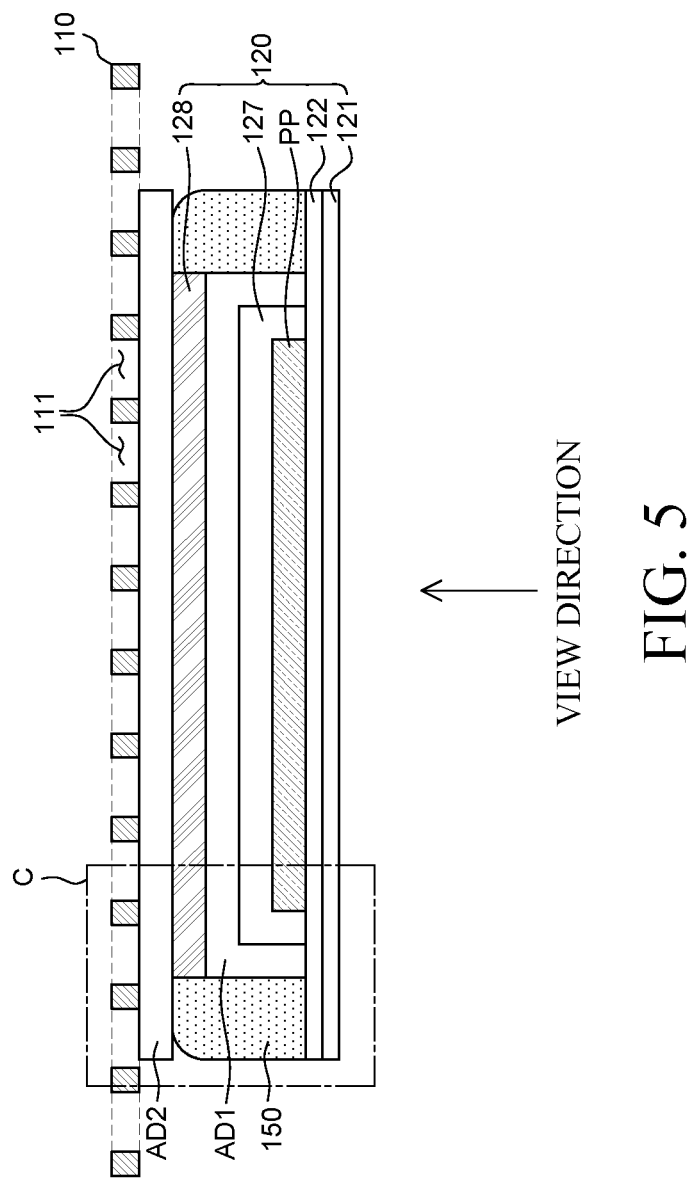
FIG. 5 is a cross-sectional view as taken along a line V-V' of FIG. 4 according to an embodiment of the present disclosure.

FIG. 4 is a plan view of the display part of the display device according to an embodiment of the present disclosure. FIG. 5 is a cross-sectional view as taken along a line V-V' of FIG. 4. Referring to FIG. 4 and FIG. 5, the display part DP includes a back cover 110, a display panel 120, the plurality of flexible films 130, the printed circuit board 140, a sealing member 150, and a support member CP. For convenience of description, FIG. 4 does not illustrate the sealing member 150. Also, FIG. 5 further illustrates a substrate 121, a buffer layer 122, the pixel part PP, an encapsulation layer 127, and an encapsulation substrate 128 of the display panel 120.

Referring to FIG. 4 and FIG. 5, the back cover 110 is disposed on a top surface of the display panel 120 and supports the display panel 120, the plurality of flexible films 130, and the printed circuit board 140. The back cover 110 may be larger in size than the display panel 120. Further, the back cover 110 can protect the other components of the display part DP against the external environment.

The back cover 110 may be formed of a rigid material, but at least a part of the back cover 110 may have flexibility so as to be wound or unwound along with the display panel 120. For example, the back cover 110 may be formed of a metal material such as steel use stainless (SUS) or a nickel-iron alloy (e.g., Invar), or plastic. However, the material of the back cover 110 is not limited thereto. The material of the back cover 110 may be changed variously according to the design as long as it can satisfy property requirements such as amount of thermal deformation, radius of curvature, rigidity, etc.

The back cover 110 includes a plurality of supporting areas PA and a plurality of flexible areas MA. In the plurality of supporting areas PA, the plurality of openings 111 is not disposed. In the plurality of flexible areas MA, the plurality of openings 111 is disposed. Specifically, a first supporting area PA1, a first flexible area MA1, a second supporting area PA2, a second flexible area MA2, and a third supporting area PA3 are disposed in sequence from the uppermost end of the back cover 110. Herein, the back cover 110 is wound or unwound in a column direction. Thus, the plurality of supporting areas PA and the plurality of flexible areas MA may be disposed in the column direction.

The first supporting area PA1 is the uppermost area of the back cover 110 and clamped to the head bar 194. The first supporting area PA1 includes the first fastening holes AH1 so as to be clamped to the head bar 194. For example, screws penetrating the head bar 194 and the first fastening holes AH1 may be provided to clamp the head bar 194 to the first supporting area PA1 of the back cover 110. Further, since the first supporting area PA1 is clamped to the head bar 194, the back cover 110 can move up or down at the same time when the link unit 192 clamped to the head bar 194 moves up or down. The display panel 120 attached to the back cover 110 can also move up or down. FIG. 4 illustrates five first fastening holes AH1, but the number of first fastening holes AH1 is not limited thereto. Further, FIG. 4 illustrates that the back cover 110 is clamped to the head bar 194 using the first fastening holes AH1. However, the present disclosure is not limited thereto. The back cover 110 may be clamped to the head bar 194 without fastening holes.

The first flexible area MA1 is extended from the first supporting area PA1 to the lower side of the back cover 110. In the first flexible area MA1, the plurality of openings 111 is disposed. The display panel 120 is attached to the first flexible area MA1. Specifically, the first flexible area MA1 is wound around or unwound from the roller 181 along with the display panel 120. The first flexible area MA1 may overlap at least the display panel 120 among the other components of the display part DP.

The second supporting area PA2 is extended from the first flexible area MA1 to the lower side of the back cover 110. The plurality of flexible films 130 connected to one end of the display panel 120 and the printed circuit board 140 are attached to the second supporting area PA2.

The second supporting area PA2 may support the plurality of flexible films 130 and the printed circuit board 140 to maintain a flat state and not to be bent to the roller 181. This is to protect the plurality of flexible films 130 and the printed circuit board 140.

Further, when the second supporting area PA2 is wound around the roller 181, the roller 181 may have a flat part of the outer peripheral surface which is in contact with the second supporting area PA2. Therefore, the second supporting area PA2 can constantly maintain a flat state regardless of whether it is wound around or unwound from the roller 181. The plurality of flexible films 130 and the printed circuit board 140 disposed in the second supporting area PA2 can also maintain a flat state.

The second flexible area MA2 is extended from the second supporting area PA2 to the lower side of the back cover 110. In the second flexible area MA2, the plurality of openings 111 is disposed. The second flexible area MA2 is extended to enable an active area AA of the display panel 120 to be presented outside the housing part HP. For example, when the back cover 110 and the display panel 120 are in the full unwinding state, an area ranging from the third supporting area PA3 of the back cover 110 fixed to the roller 181 to the second supporting area PA2 to which the plurality of flexible films 130 and the printed circuit board 140 are attached may be disposed inside the housing part HP. At the same time, the first flexible area MA1 to which the display panel 120 is attached may be presented outside the housing part HP. In this case, if a length from the third supporting area PA3 fixed to the roller 181 to the second flexible area MA2 and the second supporting area PA2 is smaller than a length from the third supporting area PA3 to the opening HPO of the housing part HP, a part of the first flexible area MA1 to which the display panel 120 is attached may be disposed inside the housing part HP. Further, since a part of a lower end of the active area AA of the display panel 120 is disposed inside the housing part HP, it may be difficult to watch images. Therefore, the length from the third supporting area PA3 fixed to the roller 181 to the second flexible area MA2 and the second supporting area PA2 may be designed to be equal to the length from the third supporting area PA3 fixed to the roller 181 to the opening HPO of the housing part HP.

The third supporting area PA3 is extended from the second flexible area MA2 to the lower side of the back cover 110. The third supporting area PA3 is the lowermost area of the back cover 110 and clamped to the roller 181. The third supporting area PA3 may include second fastening holes AH2 so as to be clamped to the roller 181. For example, screws penetrating the roller 181 and the second fastening holes AH2 may be provided to clamp the roller 181 to the third supporting area PA3 of the back cover 110. Further, since the third supporting area PA3 is clamped to the roller 181, the back cover 110 may be wound around or unwound from the roller 181. FIG. 4 illustrates two second fastening holes AH2, but the number of second fastening holes AH2 is not limited thereto.

Meanwhile, the plurality of openings 111 formed in the plurality of flexible areas MA is not formed in the first supporting area PA1, the second supporting area PA2, and the third supporting area PA3. Specifically, only the first fastening holes AH1 and the second fastening holes AH2 are formed in each of the first supporting area PA1 and the third supporting area PA3. However, the plurality of openings 111 formed in the plurality of flexible areas MA is not formed in the first supporting area PA1, the second supporting area PA2, and the third supporting area PA3. Further, the first fastening holes AH1 and the second fastening holes AH2 are different in shape from the plurality of openings 111. The first supporting area PA1 is fixed to the head bar 194, the second supporting area PA2 supports the plurality of flexible films 130 and the printed circuit board 140, and the third supporting area PA3 is fixed to the roller 181. Thus, the first supporting area PA1, the second supporting area PA2, and the third supporting area PA3 need to have higher rigidity than the plurality of flexible areas MA.

Specifically, since the first supporting area PA1, the second supporting area PA2, and the third supporting area PA3 have rigidity, the first supporting area PA1 and the third supporting area PA3 can be securely fixed to the head bar 194 and the roller 181. Further, the second supporting area PA2 can maintain a flat state of the plurality of flexible films 130 and the printed circuit board 140 so as not to be bent to protect the plurality of flexible films 130 and the printed circuit board 140. Therefore, the display part DP is fixed to the roller 181 and the head bar 194 of the moving part MP and can move in and out of the housing part HP according to an operation of the moving part MP. Also, the display part DP can protect the plurality of flexible films 130 and the printed circuit board 140.

Meanwhile, FIG. 4 illustrates that the plurality of supporting areas PA and the plurality of flexible areas MA of the back cover 110 are disposed in sequence in the column direction. However, if the back cover 110 is wound in a row direction, the plurality of supporting areas PA and the plurality of flexible areas MA may be disposed in the row direction.

Meanwhile, during winding or unwinding of the display part DP, the plurality of openings 111 disposed in the plurality of flexible areas MA of the back cover 110 may be deformed by stress applied to the display part DP. Specifically, during winding or unwinding of the display part DP, the plurality of flexible areas MA of the back cover 110 may be deformed as the plurality of openings 111 contracts or expands. Further, since the plurality of openings 111 contracts or expands, a slip phenomenon of the display panel 120 disposed on the plurality of flexible areas MA of the back cover 110 can be reduced. Therefore, stress applied to the display panel 120 can be reduced.

During winding of the display panel 120 and the back cover 110, there is a difference in length between the display panel 120 and the back cover 110 which are wound around the roller 181. This is because there is a difference in radius of curvature between the display panel 120 and the back cover 110. For example, when the back cover 110 and the display panel 120 are wound around the roller 181, the back cover 110 and the display panel 120 may need different lengths to be wound once around the roller 181. That is, the display panel 120 is disposed farther from the roller 181 than the back cover 110, and, thus, the display panel 120 may need a larger length to be wound once around the roller 181 than the back cover 110. As such, a difference in radius of curvature during winding of the display part DP causes a difference in length for winding of the back cover 110 and the display panel 120. Thus, the display panel 120 attached to the back cover 110 may slip and move from its original position. In this case, a phenomenon that the display panel 120 slips from the back cover 110 due to differences in stress and radius of curvature caused by winding may be defined as slip phenomenon. If slip occurs excessively, the display panel 120 may be detached from the back cover 110 or defects such as cracks may occur.

In this case, in the display device 100 according to an embodiment of the present disclosure, even when the display part DP is applied with stress by being wound or unwound, the plurality of openings 111 of the back cover 110 may be flexibly deformed to reduce stress applied to the back cover 110 and the display panel 120. For example, when the back cover 110 and the display panel 120 are wound around the roller 181 along the column direction, stress that deforms the back cover 110 and the display panel 120 in up and down (e.g., vertical) directions may be applied thereto. In this case, the plurality of openings 111 of the back cover 110 may expand in the up and down directions of the back cover 110 and the length of the back cover 110 may also be flexibly changed. Therefore, during winding of the back cover 110 and the display panel, a difference in length between the back cover 110 and the display panel 120 caused by a difference in radius of curvature may be compensated for by the plurality of openings 111 of the back cover 110. Further, during winding of the back cover 110 and the display panel 120, the plurality of openings 111 may be deformed to reduce stress applied to the display panel 120 from the back cover 110.

Referring to FIG. 4, the plurality of flexible films 130 is disposed in the second supporting area PA2 of the back cover 110. The plurality of flexible films 130 includes various components on a flexible base film and serves to supply signals to a plurality of sub-pixels forming a plurality of pixels and circuits in the active area AA. The plurality of flexible films 130 may be electrically connected to the display panel 120. The plurality of flexible films 130 is disposed on one end of a non-active area NA of the display panel 120 and supplies power voltage, data voltage, etc. to the plurality of sub-pixels and circuits in the active area AA. FIG. 4 illustrates four flexible films 130. However, the number of plurality of flexible films 130 is not limited thereto and may be changed variously according to the design.

Meanwhile, driver ICs such as a data driver IC may be disposed on the plurality of flexible films 130. The driver ICs are configured to process data for displaying an image and a driving signal for processing the data. The driver ICs may be mounted in a Chip-On-Glass (COG) method, a Chip-On-Film (COF) method, a Tape-Carrier-Package (TCP), or the like. However, for convenience of description, the driver ICs are described as mounted on the plurality of flexible films 130 in the COF method, but the present disclosure is not limited thereto.

Referring to FIG. 4, the printed circuit board 140 is disposed in the second supporting area PA2 of the back cover 110 and connected to the plurality of flexible films 130. The printed circuit board 140 is configured to supply signals to the driver ICs. Various components may be disposed in the printed circuit board 140 to supply various signals such as a drive signal, a data signal, etc. to the driver ICs. On the other hand, FIG. 4 illustrates a single printed circuit board 140. However, the number of printed circuit boards 140 is not limited thereto and may be changed variously according to the design.

Meanwhile, although not illustrated in FIG. 4, an additional printed circuit board connected to the printed circuit board 140 may be further disposed. For example, the printed circuit board 140 may be referred to as a source printed circuit board (source PCB) S-PCB on which a data driving unit is mounted. The additional printed circuit board connected to the printed circuit board 140 may be referred to as a control printed circuit board (control PCB) C-PCB on which a timing controller or the like is mounted. The additional printed circuit board may be disposed inside the roller 181, or may be disposed within the housing part HP outside the roller 181, or may be disposed in direct contact with the printed circuit board 140.

Referring to FIG. 4, the display panel 120 is disposed in the first flexible area MA1 of the back cover 110. The display panel 120 is configured to display images to the user. In the display panel 120, display elements for displaying images, driving elements for driving the display elements, and lines for transmitting various signals to the display elements and the driving elements may be disposed.

The display elements may be defined differently according to the kind of the display panel 120. For example, if the display panel 120 is an organic light emitting display panel, the display elements may be organic light emitting elements each composed of an anode, an organic emission layer, and a cathode. For example, if the display panel 120 is a liquid crystal display panel, the display elements may be liquid crystal display elements. Hereinafter, the display panel 120 will be assumed as an organic light emitting display panel, but the display panel 120 is not limited to the organic light emitting display panel. Further, since the display device 100 according to an embodiment of the present disclosure is a rollable display device, the display panel 120 may be implemented as a flexible display panel to be wound around or unwound from the roller 181.

Referring to FIG. 4, the display panel 120 includes the active area AA and the non-active area NA.

The active area AA refers to an area where an image is displayed on the display panel 120. In the active area AA, a plurality of sub-pixels forming a plurality of pixels and a circuit for driving the plurality of sub-pixels may be disposed. The plurality of sub-pixels is a minimum unit of the active area AA, and a display element may be disposed on each of the plurality of sub-pixels. For example, an organic light emitting element composed of an anode, an organic emission layer, and a cathode may be disposed on each of the plurality of sub-pixels, but the present disclosure is not limited thereto. Further, the circuit for driving the plurality of sub-pixels may include a driving element and a line. For example, the circuit may be composed of a thin film transistor (TFT), a storage capacitor, a gate line, a data line, etc., but is not limited thereto.

The non-active area NA refers to an area where an image is not displayed. In the non-active area NA, various lines and circuits for driving the organic light emitting elements in the active area AA may be disposed. For example, a gate driving unit for driving a gate line, a plurality of clock lines for applying clock signals to the gate driving unit, a link line for transmitting signals to the plurality of sub-pixels and circuits in the active area AA may be disposed in the non-active area NA. However, the present disclosure is not limited thereto. Details thereof will be described later with reference to FIG. 6A and FIG. 6B.

Referring to FIG. 5, the display panel 120 includes the substrate 121, the buffer layer 122, the pixel part PP, the encapsulation layer 127, and the encapsulation substrate 128.

The substrate 121 serves as a base member to support various components of the display panel 120 and may be formed of an insulating material. The substrate 121 may be formed of a flexible material in order for the display panel 120 to be wound or unwound. For example, the substrate 121 may be formed of a plastic material such as polyimide (PI).

The buffer layer 122 is disposed on the substrate 121. The buffer layer 122 may suppress diffusion of moisture and/or oxygen permeating from the outside of the substrate 121. The buffer layer 122 may be formed of an inorganic material. For example, the buffer layer 122 may be formed as a single layer or a multilayer of silicon oxide (SiOx) or silicon nitride (SiNx), but is not limited thereto.

The pixel part PP is disposed on the substrate 121 and the buffer layer 122. The pixel part PP includes a plurality of organic light emitting elements and circuits for driving the organic light emitting elements. The pixel part PP may correspond to the active area AA. The organic light emitting elements and the circuits for driving the organic light emitting elements will be described in detail later with reference to FIG. 7.

Meanwhile, the display panel 120 may be classified into a top emission type or a bottom emission type according to a transmission direction of light emitted from the organic light emitting element.

In the top emission type, light emitted from the organic light emitting element is discharged toward the upper side of the substrate 121 on which the organic light emitting element is formed. If the display panel 120 is of top emission type, a reflective layer may be further provided under the anode. This is to discharge light emitted from the organic light emitting element toward the upper side of the substrate 121, i.e., toward the cathode.

In the bottom emission type, light emitted from the organic light emitting element is discharged toward the lower side of the substrate 121 on which the organic light emitting element is formed. If the display panel 120 is of bottom emission type, the anode may be formed of a transparent conductive material only and the cathode may be formed of a metal material having high reflectivity. This is to discharge light emitted from the organic light emitting element toward the lower side of the substrate 121.

Hereafter, for convenience of description, the display device 100 according to an embodiment of the present disclosure will be described as a bottom emission type display device, but is not limited thereto.

The encapsulation layer 127 covering the pixel part PP is disposed on the pixel part PP. The encapsulation layer 127 seals the organic light emitting elements of the pixel part PP. The encapsulation layer 127 may protect the organic light emitting elements of the pixel part PP against external moisture, oxygen, impacts, and the like. The encapsulation layer 127 may be formed by alternately laminating a plurality of inorganic layers and a plurality of organic layers. For example, the inorganic layers may be formed of inorganic materials such as silicon nitride (SiNx), silicon oxide (SiOx), and aluminum oxide (AlOx), but are not limited thereto. For example, the organic layers may be formed of epoxy-based or acryl-based polymers, but are not limited thereto.

The encapsulation substrate 128 is disposed on the encapsulation layer 127. Specifically, the encapsulation substrate 128 is disposed between the encapsulation layer 127 and the back cover 110. The encapsulation substrate 128 protects the organic light emitting elements of the pixel part PP together with the encapsulation layer 127. The encapsulation substrate 128 may protect the organic light emitting elements of the pixel part PP against external moisture, oxygen, impacts, and the like. The encapsulation substrate 128 may be formed of a metal material which has high corrosion resistance and can be easily processed into foil or thin film. Examples of the metal material may include aluminum (Al), nickel (Ni), chromium (Cr), an alloy of iron (Fe) and Ni, and the like. Thus, since the encapsulation substrate 128 is formed of a metal material, the encapsulation substrate 128 can be implemented in the form of an ultra-thin film and can provide high resistance to external impacts and scratches.

A first adhesive layer AD1 may be disposed between the encapsulation layer 127 and the encapsulation substrate 128. The first adhesive layer AD1 may bond the encapsulation layer 127 and the encapsulation substrate 128. The first adhesive layer AD1 may be formed of an adhesive material and may be a thermosetting or naturally-curable adhesive. For example, the first adhesive layer AD1 may be formed of an optical clear adhesive (OCA), a pressure sensitive adhesive (PSA), or the like, but is not limited thereto.

Meanwhile, the first adhesive layer AD1 may be disposed to cover the encapsulation layer 127 and the pixel part PP. That is, the pixel part PP may be sealed by the buffer layer 122 and the encapsulation layer 127 and the encapsulation layer 127 and the pixel part PP may be sealed by the buffer layer 122 and the first adhesive layer AD1. The first adhesive layer AD1 may protect organic light emitting elements EM of the pixel part PP against external moisture, oxygen, impacts, and the like together with the encapsulation layer 127 and the encapsulation substrate 128. Herein, the first adhesive layer AD1 may further contain a moisture absorbent. The moisture absorbent may include hygroscopic particles and may absorb moisture and oxygen from the outside to minimize permeation of moisture and oxygen into the pixel part PP.

A second adhesive layer AD2 may be disposed between the encapsulation substrate 128 and the back cover 110. The second adhesive layer AD2 may bond the encapsulation substrate 128 and the back cover 110. The second adhesive layer AD2 may be formed of an adhesive material and may be a thermosetting or naturally-curable adhesive. For example, the second adhesive layer AD2 may be formed of an optical clear adhesive (OCA), a pressure sensitive adhesive (PSA), or the like, but is not limited thereto.

FIG. 4 and FIG. 5 illustrate that the plurality of openings 111 of the back cover 110 is not filled with the second adhesive layer AD2. However, some or all of the plurality of openings 111 of the back cover 110 may be filled with the second adhesive layer AD2. When the second adhesive layer AD2 fills in the plurality of openings 111 of the back cover 110, a contact area between the second adhesive layer AD2 and the back cover 110 increases. Thus, it is possible to suppress separation between the second adhesive layer AD2 and the back cover 110.

Referring to FIG. 5, the sealing member 150 may be disposed to surround a side surface of the display panel 120. In addition, a barrier film and a polarizing plate may be disposed on a rear surface of the display panel 120.

The barrier film under the display panel 120 may protect the display panel 120 against moisture, oxygen, impacts, and the like. The barrier film may allow light emitted from the pixel part PP of the display panel 120 to pass through. Also, the barrier film may be formed as a flexible transparent film so as to be wound around or unwound from the roller 181 along with the display panel 120. For example, the barrier film may be formed of a cyclic olefin polymer (COP) having optical isotropy to suppress a decrease in outdoor visibility caused by interference with phase difference between the polarizing plate and the barrier film. However, the present disclosure is not limited thereto. The barrier film may be formed of poly imide (PI), poly carbonate (PC), polyethylene terephthalate (PET), or the like.

The polarizing plate may selectively allow light to pass through and thus reduce reflection of external light incident into the display panel 120. Specifically, the display panel 120 may include various metal materials applied to semiconductor elements, lines, organic emission elements, and the like. Thus, external light incident into the display panel 120 may be reflected from the metal materials, which may cause a decrease in visibility of the display device 100. However, if the polarizing plate is provided, the polarizing plate can suppress reflection of external light and thus increase the outdoor visibility of the display device 100. In this case, as described above, the barrier film has optical isotropy and thus can allow the external light to pass through without phase retardation. Also, the polarizing plate can shield the external light which is incident into the polarizing plate through the barrier film without phase retardation so as not to be emitted to the outside of the display device 100. However, the polarizing plate may be omitted in some embodiments.

The sealing member 150 is disposed to surround a part of the side surface of the display panel 120. The sealing member 150 can reduce permeation of moisture through a side portion of the display panel 120. Specifically, the sealing member 150 is disposed to be in contact with a top surface of the buffer layer 122 protruding toward the outside of the pixel part PP and a side surface of the first adhesive layer AD1. Also, the sealing member 150 is disposed to be in contact with a side surface of the encapsulation substrate 128, a side surface of the second adhesive layer AD2, and the back cover 110 protruding from the second adhesive layer AD2. Further, referring to FIG. 5B, the sealing member 150 may be disposed to cover one end of the flexible film 130 disposed on the substrate 121 and the buffer layer 122 together. The sealing member 150 may be disposed to cover the side surface of the display panel 120 and may be formed into a ring shape corresponding to the shape of the display panel 120 on the plane, but is not limited thereto. The sealing member 150 may be formed of a curable material having a modulus value of, e.g., 50 MPa to 200 MPa. Further, the sealing member 150 may be formed of a curable material based on, e.g., acryl, urethane, and silicon, but is not limited thereto.

Hereafter, the crack detection units of the display device according to an embodiment of the present disclosure will be described in more detail with reference to FIG. 6A through FIG. 7.

<Crack Detection Unit-Crack Detection Line>

Figure 6A:
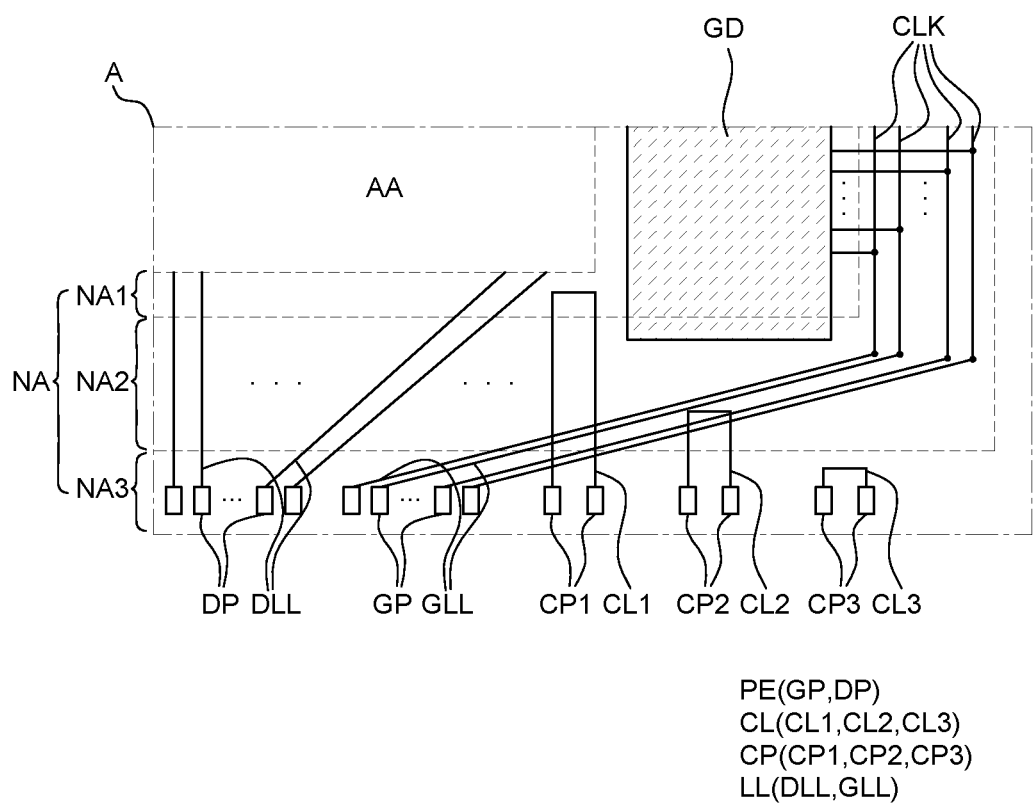
FIG. 6A is an enlarged plan view of a region "A" of FIG. 4 according to an embodiment of the present disclosure.
Figure 6B:
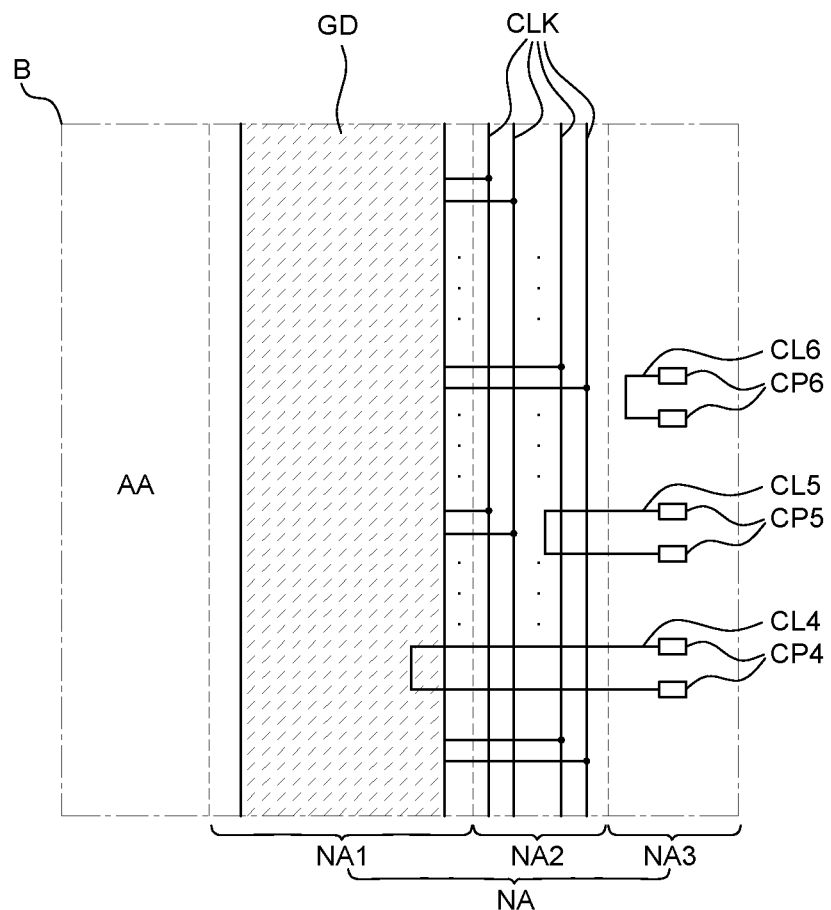
FIG. 6B is an enlarged plan view of a region "B" of FIG. 4 according to an embodiment of the present disclosure.

FIG. 6A is an enlarged plan view of a region "A" of FIG. 4. FIG. 6B is an enlarged plan view of a region "B" of FIG. 4. FIG. 7 is an enlarged cross-sectional view of a region "C" of FIG. 5. Referring to FIG. 6A through FIG. 7, the display panel 120 includes the substrate 121, a shielding pattern LS, crack detection lines CL serving as crack detection units, the buffer layer 122, and a gate insulating layer 123a. The display panel 120 also includes an interlayer insulating layer 123b, a passivation layer 124, a planarization layer 125, a bank 126, the encapsulation layer 127, the encapsulation substrate 128, and a gate driving unit GD. The display panel 120 further includes clock lines CLK, link lines LL, pads PE, crack detection pads CP, and the pixel part PP. The pixel part PP includes a plurality of semiconductor elements TR and a plurality of organic emission elements EM.

Figure 7:
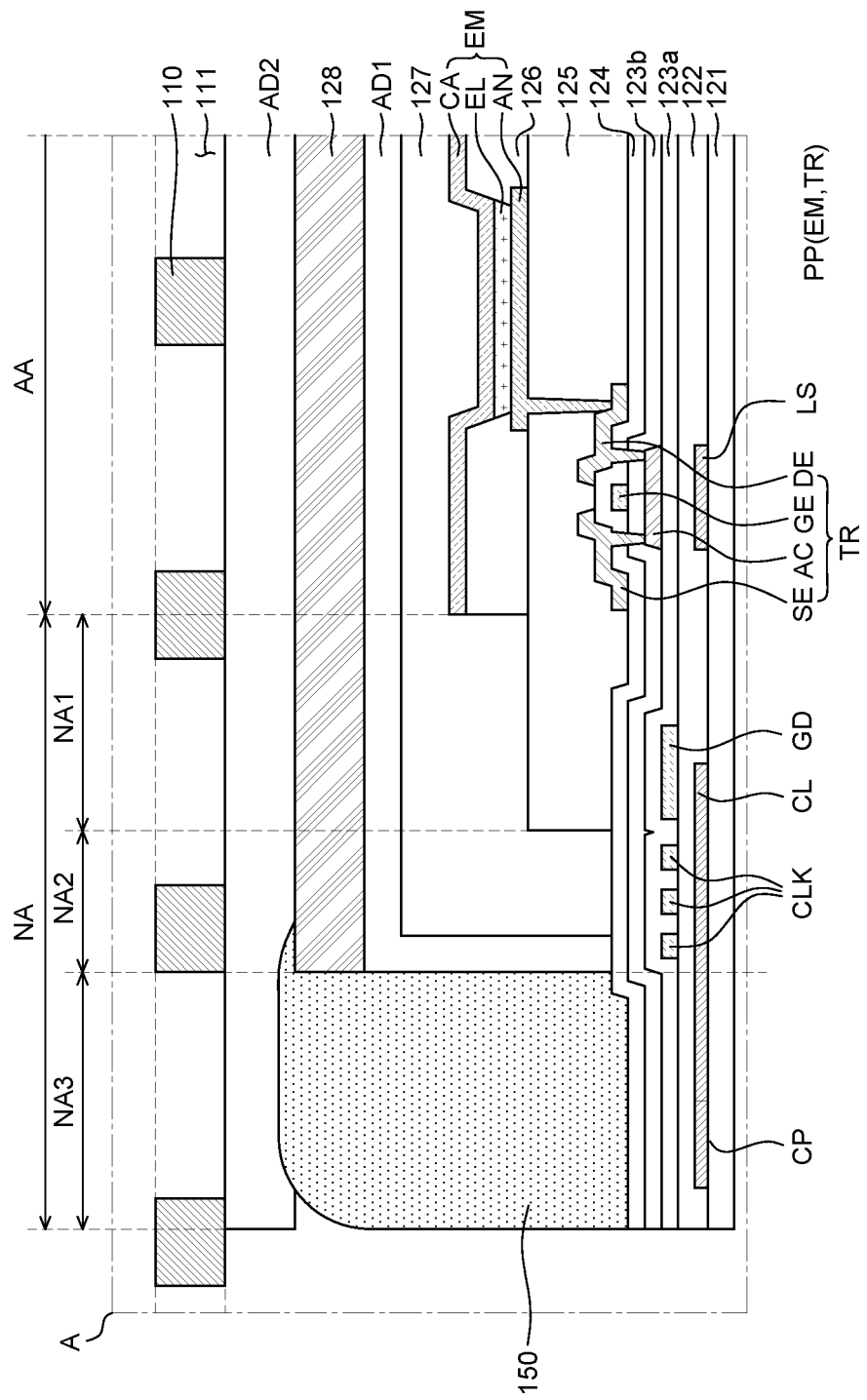
FIG. 7 is an enlarged cross-sectional view of a region "C" of FIG. 5 according to an embodiment of the present disclosure.

Referring to FIG. 7, the display panel 120 includes an active area AA and a non-active area NA. The non-active area NA includes a first non-active area NA1, a second non-active area NA2, and a third non-active area NA3.

The first non-active area NA1 is extended from the active area AA. Thus, the first non-active area NA1 may surround the active area AA. In the first non-active area NA1, the planarization layer 125 may be disposed as extended from the active area AA. In other words, the first non-active area NA1 may surround the active area AA and the planarization layer 125 may be disposed in the active area AA and the first non-active area NA1.

The second non-active area NA2 is extended from the first non-active area NA1. Thus, the second non-active area NA2 may surround the first non-active area NA1. In the second non-active area NA2, the encapsulation substrate 128 may be disposed as extended from the active area AA and the first non-active area NA1. In other words, the second non-active area NA2 may surround the first non-active area NA1 and the encapsulation substrate 128 may be disposed in the active area AA, the first non-active area NA1, and the second non-active area NA2.

The third non-active area NA3 is extended from the second non-active area NA2 and may be the outermost area of the display panel 120. Thus, the third non-active area NA3 may surround the second non-active area NA2. In the third non-active area NA3, a plurality of pads PE which can receive signals from the printed circuit board 140 and the plurality of flexible films 130 may be disposed.

That is, in the active area AA and the first non-active area NA1, both the planarization layer 125 and the encapsulation substrate 128 are disposed. Also, in the second non-active area NA2, the planarization layer 125 is not disposed but the encapsulation substrate 128 is disposed. Further, in the third non-active area NA3, neither of the planarization layer 125 and the encapsulation substrate 128 is disposed.

The shielding pattern LS is disposed on the substrate 121. The shielding pattern LS is disposed to overlap the pixel part PP. More specifically, the shielding pattern LS is disposed under the semiconductor element TR of the pixel part PP, e.g., under an active layer AC of the semiconductor element TR. The shielding pattern LS serves to shield light incident into the semiconductor element TR. To this end, the shielding pattern LS may be formed of an opaque metal material. For example, the shielding pattern LS may be formed of at least one selected from the conductive metal group consisting of aluminum (Al), tungsten (W), copper (Cu), molybdenum (Mo), chromium (Cr), titanium (Ti), molytungsten (MoW), molytitanium (MoTi), copper/molytitanium (Cu/MoTi), etc. Meanwhile, although not illustrated in FIG. 7, an additional insulating layer may be disposed between the substrate 121 and the shielding pattern LS.

Then, the buffer layer 122 is entirely disposed in the active area AA and the non-active area NA of the substrate 121.

The plurality of semiconductor elements TR is disposed on the buffer layer 122 to overlap the shielding pattern LS in the active area AA. The plurality of semiconductor elements TR may be disposed in each of a plurality of sub-pixels in the active area AA. The plurality of semiconductor elements TR disposed in each of the plurality of sub-pixels may be used as driving elements of the display device 100. The semiconductor element TR may be, e.g., a thin film transistor (TFT), an N-channel metal oxide semiconductor (NMOS), a P-channel metal oxide semiconductor (PMOS), a complementary metal oxide semiconductor (CMOS), a field effect transistor (FET), or the like. However, the present disclosure is not limited thereto. Hereinafter, the plurality of semiconductor elements TR will be assumed as TFTs, but is not limited thereto.

The semiconductor element TR includes a gate electrode GE, an active layer AC, a source electrode SE, and a drain electrode DE.

The active layer AC of the semiconductor element TR is disposed on the buffer layer 122. For example, the active layer AC may be formed of oxide semiconductor, amorphous silicon, or polysilicon, or the like, but is not limited thereto.

The gate insulating layer 123a is disposed on the active layer AC. In this case, the gate insulating layer 123a is entirely disposed in the active area AA and the non-active area NA. The gate insulating layer 123a serves to insulate the gate electrode GE from the active layer AC. The gate insulating layer 123a may be formed of an inorganic material. For example, the gate insulating layer 123a may be formed as a single layer or a multilayer of silicon oxide (SiOx) or silicon nitride (SiNx), but is not limited thereto.

The gate electrode GE is disposed on the gate insulating layer 123a. The gate electrode GE may be formed of a conductive material, e.g., copper (Cu), aluminum (Al), molybdenum (Mo), titanium (Ti), or an alloy thereof, but is not limited thereto.

The interlayer insulating layer 123b is disposed on the gate electrode GE. In this case, the interlayer insulating layer 123b is also entirely disposed in the active area AA and the non-active area NA like the gate insulating layer 123a. The interlayer insulating layer 123b serves to insulate the gate electrode GE from the source electrode SE and the drain electrode DE. The interlayer insulating layer 123b may also be formed of an inorganic material like the gate insulating layer 123a. For example, the interlayer insulating layer 123b may be formed as a single layer or a multilayer of silicon oxide (SiOx) or silicon nitride (SiNx), but is not limited thereto.

The source electrode SE and the drain electrode DE are disposed as spaced apart from each other on the interlayer insulating layer 123b. The source electrode SE and the drain electrode DE may be electrically connected to the active layer AC through contact holes formed in the gate insulating layer 123a and the interlayer insulating layer 123b. The source electrode SE and the drain electrode DE may be formed of a conductive material, e.g., copper (Cu), aluminum (Al), molybdenum (Mo), titanium (Ti), or an alloy thereof, but are not limited thereto.

The passivation layer 124 is disposed on the semiconductor element TR. The passivation layer 124 may be entirely disposed in the active area AA and the non-active area NA.

The passivation layer 124 is an insulating layer for protecting the components under the passivation layer 124. The passivation layer 124 may be formed of an inorganic material. For example, the passivation layer 124 may be formed as a single layer or a multilayer of silicon oxide (SiOx) or silicon nitride (SiNx), but is not limited thereto. The passivation layer 124 may be omitted according to the design.

The planarization layer 125 is disposed on the passivation layer 124. The planarization layer 125 may flatten an upper part of the substrate 121 including the semiconductor element TR. The planarization layer 125 is disposed in the entire active area AA and in a part of the non-active area NA. Specifically, the planarization layer 125 may flatten an upper part of the active area AA and the first non-active area NA1 extended from the active area AA. Specifically, the planarization layer 125 may be disposed in the active area AA and the first non-active area NA1 and may not be disposed in the second non-active area NA2 and the third non-active area NA3. The planarization layer 125 may be formed of an organic material. For example, the planarization layer 125 may be formed as a single layer or a multilayer of an acryl-based organic material, but is not limited thereto.

The planarization layer 125 may be disposed only in the first non-active area NA1 extended from the active area AA among the non-active area NA. Also, the encapsulation layer 127 and the first adhesive layer AD1 may surround a side surface and a top surface of the planarization layer 125. Specifically, the planarization layer 125 is formed of an organic material and thus vulnerable to moisture. The planarization layer 125 may be entirely formed in the active area AA and the non-active area NA like the buffer layer 122, the gate insulating layer 123a, the interlayer insulating layer 123b, and the passivation layer 124. Also, the side surface of the planarization layer 125 may not be surrounded by the encapsulation layer 127 and the first adhesive layer AD1. However, in this case, moisture permeating through the side surface of the planarization layer 125 may be transported to the active area AA and then may cause degradation of the organic emission element EM. Accordingly, the planarization layer 125 is disposed only to the first non-active area NA1. Also, the encapsulation layer 127 and the encapsulation substrate 128 are disposed in the second non-active area NA2 so as to surround the planarization layer 125. Thus, it is possible to reduce permeation of moisture through the planarization layer 125 and improve the reliability of the display device 100.

The organic emission element EM is disposed on the planarization layer 125. The organic emission element EM is a self-light emitting element and may be disposed in each of the plurality of sub-pixels and driven by the plurality of the semiconductor elements TR. The organic emission element EM may include an anode AN which is a first electrode, an organic emission layer EL, and a cathode CA which is a second electrode.

The anode AN may supply holes into the organic emission layer EL and may be formed of a conductive material having a high work function. For example, the anode AN may be formed of tin oxide (TO), indium tin oxide (ITO), indium zinc oxide (IZO), indium zinc tin oxide (ITZO), or the like, but is not limited thereto.

The bank 126 is disposed on the anode AN. The bank 126 is disposed to overlap the active area AA and cover an edge of the anode AN. The bank 126 is disposed at the boundary between adjacent sub-pixels and may suppress color mixing of light emitted from the organic emission elements EM in the respective sub-pixels. The bank 126 may be formed of an insulating material. For example, the bank 126 may be formed of resin based on polyimide, acryl, or benzocyclobutene (BCB), but is not limited thereto.

The organic emission layer EL is disposed on the anode NA exposed through the bank 126. The organic emission layer EL may receive holes from the anode AN and electrons from the cathode CA and emit light. The organic emission layer EL may be one of a red organic emission layer, a green organic emission layer, a blue organic emission layer, and a white organic emission layer according to the color of light emitted from the organic emission layer EL. In this case, if the organic emission layer EL is a white organic emission layer, color filters of various colors may be further provided.

The cathode CA is disposed on the organic emission layer EL and the bank 126. The cathode CA may be disposed at least on a front surface of the active area AA. The cathode CA may supply electrons into the organic emission layer EL and may be formed of a conductive layer having a low work function. For example, the cathode CA may be formed of one or more materials selected from the group consisting of metals such as magnesium (Mg), silver (Ag), and aluminum (Al) and alloys thereof, but is not limited thereto. Further, since the display device 100 is of bottom emission type, the cathode CA may reflect light emitted from the organic emission layer EL toward the substrate 121.

Referring to FIG. 6A and FIG. 6B, the gate driving unit GD and a plurality of clock lines CLK are disposed on the buffer layer 122 in the first non-active area NA1 and the second non-active area NA2. Specifically, the gate driving unit GD may be disposed in the first non-active area NA1 and the second non-active area NA2 adjacent to the left edge and the right edge of the display panel 120. Further, the plurality of clock lines CLK may be disposed in the second non-active area NA2 adjacent to the outside of the gate driving unit GD. However, the present disclosure is not limited thereto. The gate driving unit GD and the plurality of clock lines CLK may be disposed in the first non-active area NA1 and the second non-active area NA2 adjacent to one of the left edge and the right edge of the display panel 120.

The gate driving unit GD may output a gate voltage and a light emission control voltage under the control of a timing controller and select a sub-pixel to be charged with a data voltage through lines such as a gate line and a light emission control signal line. Thus, the gate driving unit GD can control light emitting timing. The gate driving unit GD may shift the gate voltage and the light emission control voltage using a shift register and then sequentially supply the gate voltage and the light emission control voltage. The gate driving unit GD may be formed directly on the substrate 121 by a Gate-driver In Panel (GIP) method as shown in FIG. 6A and FIG. 6B, but is not limited thereto. FIG. 7 illustrates that the gate driving unit GD is formed of the same material on the same layer as the gate electrode GE. However, the present disclosure is not limited thereto. The gate driving unit GD may be composed of various components such as various semiconductor elements, lines, capacitors, etc., and may be formed of a different material on a different layer from the gate electrode GE.

The plurality of clock lines CLK applies a plurality of clock signals having different phases to the gate driving unit GD. To this end, the plurality of clock lines CLK may be extended in the same direction as an extension direction of the gate driving unit GD and connected to each stage of the gate driving unit GD. Further, as shown in FIG. 7, the plurality of clock lines CLK may be formed of the same material on the same layer as the gate electrode GE of the semiconductor element TR, but is not limited thereto. That is, the plurality of clock lines CLK may also be formed of a conductive material, e.g., copper (Cu), aluminum (Al), molybdenum (Mo), titanium (Ti), or an alloy thereof, but is not limited thereto.

The plurality of pads PE is disposed in the third non-active area NA3. Thus, the third non-active area NA3 where the plurality of pads is disposed may be referred to as a pad area. The plurality of pads PE serves as electrodes for electrically connecting the plurality of flexible films 130 and the display panel 120. Signals from the printed circuit board 140 and the plurality of flexible films 130 can be transmitted through the plurality of pads PE to the plurality of sub-pixels in the active area AA. Specifically, as shown in FIG. 6A, the plurality of pads PE may include gate pads GP and data pads DP. The gate pads GP may be connected to the plurality of clock lines CLK, and the data pads DP may be connected to data lines in the active area AA. Further, the gate pads GP and the data pads DP may be formed of the same material by the same process as the gate electrode GE, the source electrode SE and/or the drain electrode DE, but are not limited thereto.

The link lines LL are disposed in the non-active area NA of the display panel 120. The link lines LL are electrically connected to the plurality of pads PE and transmit signals from the plurality of pads PE to the plurality of sub-pixels in the active area AA. Specifically, the link lines LL may include data link lines DLL connecting the data pad DP and the data lines in the active area AA and gate link lines GLL connecting the gate pad GP and the plurality of clock lines CLK. As described above, the data pads DP disposed in the third non-active area NA3 are connected to the data lines in the active area AA through the data link lines DLL. Thus, the data link lines DLL are disposed in the first non-active area NA1, the second non-active area NA2, and the third non-active area NA3. Further, the gate pads GP disposed in the third non-active area NA3 are connected to the clock lines CLK disposed in the second non-active area NA2 through the gate link lines GLL. Thus, the gate link lines GLL are disposed in the first non-active area NA1 and the second non-active area NA2.

In this case, the link lines LL may be formed of the same material by the same process as the gate electrode GE, the source electrode SE and/or the drain electrode DE, but are not limited thereto.

Meanwhile, for convenience of description, FIG. 6A illustrates that the link lines LL are disposed only in the non-active area NA. However, the link lines LL may be extended to the active area AA, but are not limited thereto.

In the display device 100 having the above-described structure, the encapsulation substrate 128 is disposed to the second non-active area NA2, but is not disposed in the third non-active area NA3. Further, during winding of the display part DP, the second non-active area NA2 where the encapsulation substrate 128 formed of a rigid material is disposed may be applied with more stress relatively. Also, during winding of the display part DP, the third non-active area NA3 where the encapsulation substrate 128 is not disposed may be applied with less stress relatively. Therefore, stress applied to the display panel 120 may be sharply changed around an edge of the encapsulation substrate 128, i.e., at the boundary between the second non-active area NA2 and the third non-active area NA3.

Meanwhile, in the second non-active area NA2 and the third non-active area NA3 adjacent to the edge of the encapsulation substrate 128, the planarization layer 125 is not disposed. Only the buffer layer 122, the gate insulating layer 123a, the interlayer insulating layer 123b, and the passivation layer 124 are disposed therein. The planarization layer 125 formed of an organic material has low rigidity and high flexibility and thus can absorb and buffer stress. The buffer layer 122, the gate insulating layer 123a, the interlayer insulating layer 123b, the passivation layer 124, the link lines LL, the substrate 121, and the like formed of a material having high rigidity and low flexibility can be more easily cracked by stress. Particularly, they are highly likely to be cracked by a sharp change in stress at the edge of the encapsulation substrate 128.

Therefore, at the boundary between the second non-active area NA2 and the third non-active area NA3 adjacent to the edge of the encapsulation substrate 128 where stress is sharply change, the planarization layer 125 which can absorb tensile stress and compressive stress and thus can suppress cracks is not disposed. Instead, only the buffer layer 122, the gate insulating layer 123a, the interlayer insulating layer 123b, the passivation layer 124, the link lines LL and the substrate 121 formed of a material which has high rigidity and low flexibility and thus can be easily cracked are disposed. Therefore, the boundary between the second non-active area NA2 and the third non-active area NA3 is highly likely to be cracked.

The buffer layer 122, the gate insulating layer 123a, the interlayer insulating layer 123b, the passivation layer 124, the link lines LL, the substrate 121, or the like may be cracked by winding and unwinding of the display panel 120. In this case, cracks may be propagated to the components adjacent to the buffer layer 122, the gate insulating layer 123a, the interlayer insulating layer 123b, the passivation layer 124, the link lines LL and the substrate 121. Thus, lines or the like may be damaged and the reliability of the display device 100 may be degraded.

Thus, at the boundary between the first non-active area NA1 and the second non-active area NA2 where the planarization layer 125 capable of absorbing and buffering stress is disposed and the boundary between the second non-active area NA2 and the third non-active area NA3 where the planarization layer 125 is not disposed and stress is sharply changed due to the presence and absence of the encapsulation substrate 128, it is necessary to previously detect a crack in the buffer layer 122, the gate insulating layer 123a, the interlayer insulating layer 123b, the passivation layer 124, the link lines LL and the substrate 121 formed of a material having high rigidity and low flexibility. This is to previously monitor the reliability of the display device 100 and improve the process.

To this end, the display device 100 according to an embodiment of the present disclosure may include a plurality of crack detection units and a plurality of crack detection pads CP disposed in the non-active area NA where cracks may occur.

Referring to FIG. 6A and FIG. 6B, the plurality of crack detection units may be composed of a plurality of crack detection lines CL. Thus, each of the plurality of crack detection units may detect whether a crack occurs in a corresponding region of the display device 100 based on whether a crack occurs in each of the plurality of crack detection lines CL.

The plurality of crack detection lines CL may include a first crack detection line CL1 and a fourth crack detection line CL4 disposed in the first non-active area NA1, the second non-active area NA2, and the third non-active area NA3. The plurality of crack detection lines CL may also include a second crack detection line CL2 and a fifth crack detection line CL5 disposed in the second non-active area NA2 and the third non-active area NA3. The plurality of crack detection lines CL may further include a third crack detection line CL3 and a sixth crack detection line CL6 disposed in the third non-active area NA3. Herein, the first, second, and third crack detection lines CL1, CL2, and CL3 may be disposed in the non-active area NA on one side of the active area AA where the pads PE are disposed. Further, the fourth, fifth, and sixth crack detection lines CL4, CL5, and CL6 may be disposed in the non-active area NA on one side of the active area AA where the gate driving unit GD is disposed.

The plurality of crack detection pads CP is disposed in the third non-active area NA3. The plurality of crack detection pads CP is connected to the plurality of crack detection lines CL of the plurality of crack detection units and used to detect whether a crack occurs inside the display device 100. The plurality of crack detection pads CP includes a first crack detection pad CP1, a second crack detection pad CP2, a third crack detection pad CP3, a fourth crack detection pad CP4, a fifth crack detection pad CP5, and a sixth crack detection pad CP6. Herein, the first, second, and third crack detection pads CP1, CP2, and CP3 may be disposed in the non-active area NA on one side of the active area AA where the pads PE are disposed. Further, the fourth, fifth, and sixth crack detection pads CP4, CP5, and CP6 may be disposed in the non-active area NA on one side of the active area AA where the gate driving unit GD is disposed.

The plurality of crack detection lines CL and the plurality of crack detection pads CP may be formed of the same material as one of various conductive components disposed in the active area AA. For example, the plurality of crack detection lines CL and the plurality of crack detection pads CP may be formed of the same material as one of various conductive components such as the shielding pattern LS, the gate electrode GE, the source electrode SE, the drain electrode DE, and the anode AN. Herein, the plurality of crack detection lines CL needs to be disposed to overlap the gate link lines GLL, the clock lines CLK, and the gate driving unit GD. Thus, they may be formed of the same material as the shielding pattern LS or the anode AN which is not disposed in the gate link lines GLL, the clock lines CLK, and the gate driving unit GD. However, the present disclosure is not limited thereto.

Referring to FIG. 6A and FIG. 6B, the plurality of crack detection lines CL may have a loop shape extended from the plurality of crack detection pads CP. That is, each of the plurality of crack detection lines CL may have a loop shape extended from the plurality of crack detection pads CP.

Specifically, the first crack detection line CL1 may have a loop shape extended from one of the first crack detection pads CP1 to the other one of the first crack detection pads CP1 through the third non-active area NA3, the second non-active area NA2, the first non-active area NA1, the second non-active area NA2, and the third non-active area NA3. Further, the second crack detection line CL2 may have a loop shape extended from one of the second crack detection pads CP2 to the other one of the second crack detection pads CP2 through the third non-active area NA3, the second non-active area NA2, and the third non-active area NA3. Furthermore, the third crack detection line CL3 may have a loop shape extended from one of the third crack detection pads CP3 to the other one of the third crack detection pads CP3 through the third non-active area NA3. Moreover, the fourth crack detection line CL4 may have a loop shape extended from one of the fourth crack detection pads CP4 to the other one of the fourth crack detection pads CP4 through the third non-active area NA3, the second non-active area NA2, the first non-active area NA1, the second non-active area NA2, and the third non-active area NA3. Also, the fifth crack detection line CL5 may have a loop shape extended from one of the fifth crack detection pads CP5 to the other one of the fifth crack detection pads CP5 through the third non-active area NA3, the second non-active area NA2, and the third non-active area NA3. Further, the sixth crack detection line CL6 may have a loop shape extended from one of the sixth crack detection pads CP6 to the other one of the sixth crack detection pads CP6 through the third non-active area NA3.

A worker may measure a resistance or current from the plurality of crack detection pads CP connected to both ends of each of the plurality of crack detection lines CL in the display device 100 according to an embodiment of the present disclosure. Thus, the worker can measure whether the plurality of crack detection lines CL is disconnected. For example, the worker may measure a resistance or current from the first crack detection pads CP1 connected to both ends of the first crack detection line CL1 and the fourth crack detection pads CP4 connected to both ends of the fourth crack detection line CL4. Thus, the worker can measure whether the first crack detection line CL1 and the fourth crack detection line CL4 are disconnected. Therefore, it is possible to detect whether a crack occurs in the first non-active area NA1, the second non-active area NA2, and the third non-active area NA3 of the display device 100. Further, the worker may measure a resistance or current from the second crack detection pads CP2 connected to both ends of the second crack detection line CL2 and the fifth crack detection pads CP5 connected to both ends of the fifth crack detection line CL5. Thus, the worker can measure whether the second crack detection line CL2 and the fifth crack detection line CL5 are disconnected. Therefore, it is possible to detect whether a crack occurs in the second non-active area NA2 and the third non-active area NA3 of the display device 100. Further, the worker may measure a resistance or current from the third crack detection pads CP3 connected to both ends of the third crack detection line CL3 and the sixth crack detection pads CP6 connected to both ends of the sixth crack detection line CL6. Thus, the worker can measure whether the third crack detection line CL3 and the sixth crack detection line CL6 are disconnected. Therefore, it is possible to detect whether a crack occurs in the third non-active area NA3 of the display device 100.

Specifically, if the first crack detection line CL1 is disconnected, it can be determined that a crack occurs in any one of the first non-active area NA1, the boundary between the first non-active area NA1 and the second non-active area NA2, the second non-active area NA2, the boundary between the second non-active area NA2 and the third non-active area NA3, and the third non-active area NA3. Further, if the second crack detection line CL2 is disconnected, it can be determined that a crack occurs in any one of the second non-active area NA2, the boundary between the second non-active area NA2 and the third non-active area NA3, and the third non-active area NA3. Further, if the third crack detection line CL3 is disconnected, it can be determined that a crack occurs in the third non-active area NA3.

That is, it is possible to determine a crack position in the display device 100 by measuring whether the plurality of crack detection lines CL is disconnected. For example, if the first crack detection line CL1 is disconnected but the second crack detection line CL2 is connected, it can be determined that a crack occurs in the first non-active area NA1 or at the boundary between the first non-active area NA1 and the second non-active area NA2. Further, if the second crack detection line CL2 is disconnected but the third crack detection line CL3 is connected, it can be determined that a crack occurs in the second non-active area NA2 or at the boundary between the second non-active area NA2 and the third non-active area NA3.

Meanwhile, FIG. 6A and FIG. 6B illustrate that the plurality of crack detection pads CP is disposed in the third non-active area NA3. However, the plurality of crack detection pads CP may be disposed in a separate printed circuit board. Thus, the worker may detect whether a crack occurs in the plurality of crack detection lines CL using the plurality of crack detection pads CP disposed in the printed circuit board.

Further, in some embodiments, the plurality of crack detection lines CL may include only the first crack detection line CL1, the second crack detection line CL2, and the third crack detection line CL3. Otherwise, the plurality of crack detection lines CL may include only the fourth crack detection line CL4, the fifth crack detection line CL5, and the sixth crack detection line CL6. That is, the plurality of crack detection lines CL may be disposed in any one of the non-active area NA on one side of the active area AA where the pads PE are disposed or the non-active area NA on one side of the active area AA where the gate driving unit GD is disposed.

As described above, at the boundary between the first non-active area NA1 and the second non-active area NA2 where the planarization layer 125 capable of absorbing and buffering stress is disposed and the boundary between the second non-active area NA2 and the third non-active area NA3 where the planarization layer 125 is not disposed and stress is sharply changed due to the presence and absence of the encapsulation substrate 128, it is necessary to previously detect a crack in the buffer layer 122, the gate insulating layer 123a, the interlayer insulating layer 123b, the passivation layer 124, the link lines LL and the substrate 121 formed of a material having high rigidity and low flexibility. This is to previously monitor the reliability of the display device 100 and improve the process.

Particularly, if the display device 100 according to an embodiment of the present disclosure is a rollable display device wound around or unwound from the roller 181, a reliability test is performed to test whether the display device 100 operates normally after tens of thousands of windings and unwindings.

However, in the currently reliability test, an encapsulation substrate needs to be removed and a crack position is determined by the naked eye using a microscope or the like. That is, if an encapsulation substrate formed of an opaque metal material is used, the encapsulation substrate needs to be removed. If not, it is difficult to check whether a crack occurs in various insulating layers or conductive layers disposed under the encapsulation substrate. Further, a display panel needs to be separated from a roller and a back cover to remove the encapsulation substrate. Therefore, a very cumbersome separation process is required to perform the reliability test and processing time increases.

However, in the display device 100 according to an embodiment of the present disclosure, it is possible to more easily detect whether a crack occurs in the display device 100 and a crack position by using the plurality of crack detection units disposed in the non-active area NA. That is, each of the plurality of crack detection lines CL of the plurality of crack detection units is disposed across different areas of the non-active area NA. Thus, it is possible to easily determine whether a crack occurs and a crack position by using the plurality of crack detection lines CL without removing the encapsulation substrate 128. Particularly, the display device 100 according to an embodiment of the present disclosure uses the plurality of crack detection lines CL disposed differently in each of the first non-active area NA1 where the encapsulation substrate 128 and the planarization layer 125 are disposed, the second non-active area NA2 where only the encapsulation substrate 128 among the encapsulation substrate 128 and the planarization layer 125 is disposed, and the third non-active area NA3 where the planarization layer 125 and the encapsulation substrate 128 are not disposed. Thus, it is possible to more easily determine whether a crack occurs due to the presence and absence of the planarization layer 125 and a crack position. Also, it is possible to more easily determine whether a crack occurs and a crack position at the boundary of the encapsulation substrate 128. Therefore, in the display device 100 according to an embodiment of the present disclosure, it is possible to more easily determine whether a crack occurs and a crack position in the display device 100 without removing the encapsulation substrate 128, the roller 151, the back cover 110, or the like. Processing time and workers for performing crack detection can be reduced. Also, processing conditions can be changed based on whether a crack occurs and a crack position. Therefore, the processing yield of the display device 100 can be improved.

<Crack Detection Unit-Crack Detection Transistor>

Figure 8:
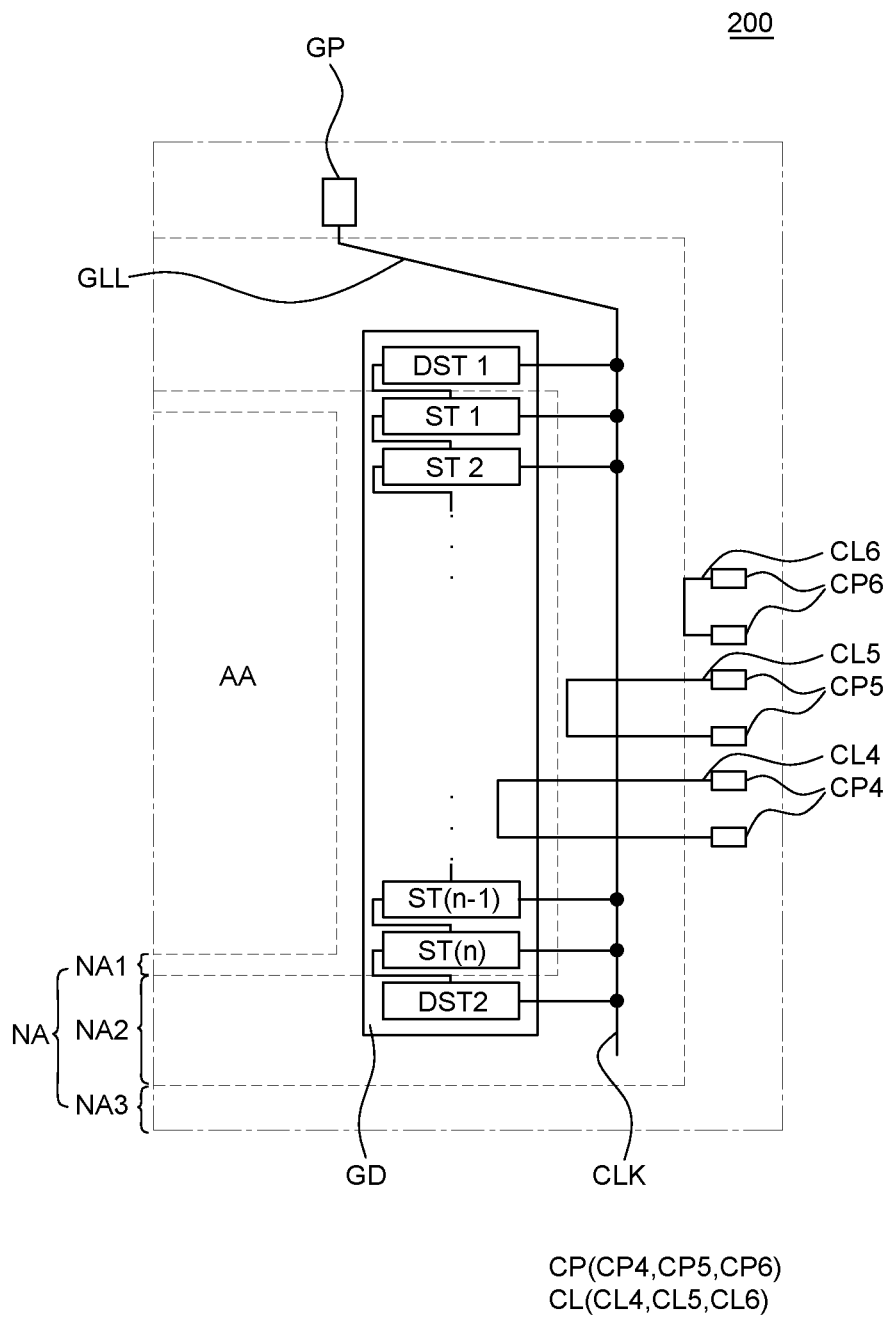
FIG. 8 is a view provided to explain a display device according to another embodiment of the present disclosure.
Figure 9:
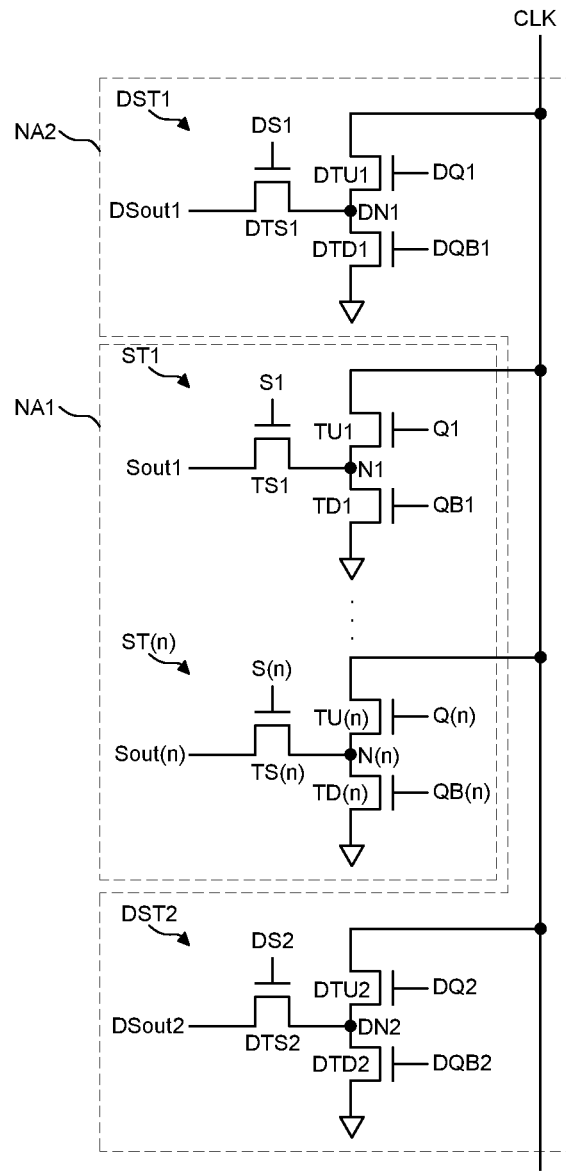
FIG. 9 is a circuit diagram provided to explain the display device according to another embodiment of the present disclosure.

FIG. 8 is provided to explain a display device according to another embodiment of the present disclosure. FIG. 9 is a circuit diagram provided to explain the display device according to another embodiment of the present disclosure. A display device 200 illustrated in FIG. 8 and FIG. 9 has substantially the same configuration as the display device 100 illustrated in FIG. 1 through FIG. 7 except the configuration of crack detection units. Therefore, redundant description of the same components will not be provided.

Referring to FIG. 8, the gate driving unit GD of the display device 200 according to another embodiment of the present disclosure includes a plurality of stages DST1, ST1, ST2, . . . ST(n-1), ST(n), DST2 each connected to a clock line CLK. Specifically, the plurality of stages DST1, ST1, ST2, . . . ST(n-1), ST(n), DST2 may include a plurality of driving stages ST1, ST2, . . . ST(n-1), ST(n) disposed in the first non-active area NA1. Also, the plurality of stages DST1, ST1, ST2, . . . ST(n-1), ST(n), DST2 may include a plurality of dummy stages DST1 and DST2 disposed in the second non-active area NA2. That is, the plurality of dummy stages DST1 and DST2 disposed in the second non-active area NA2 may be disposed on front and rear ends of the plurality of driving stages ST1, ST2, . . . ST(n-1), ST(n) disposed in the first non-active area NA1. FIG. 8 illustrates a single clock line CLK. However, the number of clock lines CLK is not limited thereto and may be more than one according to the design of the gate driving unit GD. In this case, clock signals having different phases may be applied through the respective clock lines CLK.

The plurality of dummy stages DST1 and DST2 may include a first dummy stage DST1 disposed on a front end of a first driving stage ST1 and a second dummy stage DST2 disposed on a rear end of a second driving stage ST2. Further, each of the plurality of dummy stages DST1 and DST2 may be provided only to drive the plurality of driving stages ST1, ST2, to ST(n-1), ST(n) and may not be connected to the gate lines in the active area AA. Meanwhile, according to the design of the gate driving unit GD, the plurality of dummy stages DST1 and DST2 may not be used and only the plurality of driving stages ST1, ST2, to ST(n-1), ST(n) may be used.

Output terminals N1 ... N(n) of the plurality of driving stages ST1 ... ST(n) are connected to the gate lines and serve to drive a plurality of pixel parts PP. Referring to FIG. 9, the plurality of stages DST1, ST1, ... ST(n), DST2 may include pull-up transistors DTU1, TU1 ... TU(n), DTU2 and pull-down transistors DTD1, TD1 ... TD(n), DTD2 that control voltages of output terminals DN1, N1 ... N(n), DN2, respectively.

The dummy stages DST1 and DST2 and the driving stages ST1 ... ST(n) have the same internal circuit structure. Therefore, hereafter, the internal circuit structures of the first driving stage ST1 and the first dummy stage DST1 will be described as examples.

First, the first driving stage ST1 includes a first pull-up transistor TU1 that outputs a clock signal from the clock line CLK to an output terminal N1 according to a voltage of a first Q node Q1. Also, the first driving stage ST1 includes a first pull-down transistor TD1 that outputs a low-potential voltage to the output terminal N1 according to a voltage of a first QB node QB1.

Specifically, a source electrode of the first pull-up transistor TU1 is connected to the clock line CLK1 and a drain electrode of the first pull-up transistor TU1 is connected to the first output terminal Ni. Also, a gate electrode of the first pull-up transistor TU1 is connected to the first Q node Q1. Thus, if the first Q node Q1 has a high-level voltage, the first pull-up transistor TU1 is turned on and a clock signal applied to the clock line CLK is applied to the first output terminal N1.

A source electrode of the first pull-down transistor TD1 is grounded and a drain electrode of the first pull-down transistor TD1 is connected to the first output terminal N1. Also, a gate electrode of the first pull-down transistor TD1 is connected to the first QB node QB1. Thus, if the first QB node QB1 has a high-level voltage, the first pull-down transistor TD1 is turned on and, for example, a low-potential voltage which is a ground voltage is applied to the first output terminal N1.

However, the above-described circuit structure of the first driving stage ST1 is just an example and can be changed variously according to various designs of the gate driving unit GD.

Then, the first dummy stage DST1 includes a first dummy pull-up transistor DTU1 that outputs a clock signal to a first dummy output terminal DN1 according to a voltage of a first DQ node DQ1. Also, the first dummy stage DST1 includes a first dummy pull-down transistor DTD1 that outputs a low-potential voltage to the first dummy output terminal DN1 according to a voltage of a first DQB node DQB1. Herein, the connection structure and operation of the plurality of transistors in the first dummy stage DST1 are identical to those of the plurality of transistors in the first driving stage ST1.

That is, a source electrode of the first dummy pull-up transistor DTU1 is connected to the clock line CLK and a drain electrode of the first dummy pull-up transistor DTU1 is connected to the first dummy output terminal DN1. Also, a gate electrode of the first dummy pull-up transistor DTU1 is connected to the first dummy Q node DQ1. Thus, if the first dummy Q node DQ1 has a high-level voltage, the first dummy pull-up transistor DTU1 is turned on and a clock signal applied to the clock line CLK is applied to the first dummy output terminal DN1.

A source electrode of the first dummy pull-down transistor DTD1 is grounded and a drain electrode of the first dummy pull-down transistor DTD1 is connected to the first dummy output terminal DN1. Also, a gate electrode of the first dummy pull-down transistor DTD1 is connected to the first dummy QB node DQB1. Thus, if the first dummy QB node DQB1 has a high-level voltage, the first dummy pull-down transistor DTD1 is turned on and a low-potential voltage which is a ground voltage is applied to the first dummy output terminal DN1.

However, the above-described circuit structure of the first dummy stage DST1 is just an example and can be changed variously according to various designs of the gate driving unit GD.

In the display device 200 according to another embodiment of the present disclosure, crack detection units may be included in each of the plurality of stages DST1, ST1, ST2, ... ST(n-1), ST(n), DST2 of the gate driving unit GD. Specifically, the plurality of stages DST1, ST1, ST2, ... ST(n-1), ST(n), DST2 may further include detection transistors DTS1, TS1 ... TS(n), DTS2 that sense output voltages of the output terminals DN1, N1 ... N(n), DN2 and crack detection terminals DSout1, Sout1, ... Sout(n), DSout2, respectively. The detection transistors DTS1, TS1 ... TS(n), DTS2 may be formed at the same time as various transistors disposed in the plurality of stages DST1, ST1, ST2, ... ST(n-1), ST(n), DST2.

As described above, the dummy stages DST1 and DST2 and the driving stages ST1 ... ST(n) have the same internal circuit structure. Therefore, hereafter, detection transistors DTS1 and TS1 disposed in the first driving stage ST1 and the first dummy stage DST1, respectively, will be described as examples.

First, the first driving stage ST1 includes a first detection transistor TS1 that senses a voltage of the first output terminal N1 in response to a detection signal S1.

A source electrode of the first detection transistor TS1 is connected to the first output terminal N1 and a drain electrode of the first detection transistor TS1 is connected to a first crack detection terminal Sout1. Also, a gate electrode of the first detection transistor TS1 is applied with the detection signal Si. Thus, if the detection signal S1 has a high level, the first detection transistor TS1 is turned on and a voltage of the first output terminal Ni is applied to the first crack detection terminal Sout1.

Then, the first dummy stage DST1 includes a first dummy detection transistor DTS1 that senses a voltage of the first dummy output terminal DN1 in response to a first dummy detection signal DS1.

A source electrode of the first dummy detection transistor DTS1 is connected to the first dummy output terminal DN1 and a drain electrode of the first dummy detection transistor DTS1 is connected to a first dummy crack detection terminal DSout1. Also, a gate electrode of the first dummy detection transistor DTS1 is applied with the dummy detection signal DS1. Thus, if the dummy detection signal DS1 has a high level, the first dummy detection transistor DTS1 is turned on and a voltage of the first dummy output terminal DN1 is applied to the first dummy crack detection terminal DSout1.

Although not illustrated in FIG. 8 and FIG. 9, the crack detection terminals DSout1, Sout1, ... Sout(n), DSout2 may be connected to crack detection pads. Further, gate electrodes of the respective detection transistors DTS1, TS1 ... TS(n), DTS2 may also be connected to the crack detection pads. Thus, the worker may determine whether a crack occurs and a crack position in the display device 200 by using the crack detection pads.

In the present disclosure, the plurality of stages DST1, ST1, ST2, ... ST(n-1), ST(n), DST2 has been described as including the respective detection transistors DTS1, TS1 TS(n), DTS2 which are crack detection units. However, the present disclosure is not limited thereto. The detection transistors DTS1, TS1 . . . TS(n), DTS2 which are crack detection units may be defined as components separate from the plurality of stages DST1, ST1, ST2, . . . ST(n−1), ST(n), DST2.

Hereafter, an example method for detecting a crack will be described based on the first driving stage ST1 and the first dummy stage DST1 having the above-described connection structure in the display device 200 according to another embodiment of the present disclosure.

For example, to determine whether a crack occurs using the first dummy detection transistor DTS1 disposed in the first dummy stage DST1, the worker may input the first dummy detection signal DS1 of high level to the first dummy detection transistor DTS1. Also, the worker may input a high-level signal to the first dummy Q node DQ1. In this case, if a clock signal is measured from the first dummy crack detection terminal DSoutl, it can be determined that no crack occurs in a region from the first dummy crack detection terminal DSoutl to the gate link line GLL. That is, it can be determined that no crack occurs in the second non-active area NA2, the boundary between the second non-active area NA2 and the first non-active area NA1, and the third non-active area NA3.

On the other hand, if a clock signal is not measured from the first dummy crack detection terminal DSoutl, it can be determined that a crack occurs in the region from the first dummy crack detection terminal DSoutl to the gate link line GLL. That is, it can be determined that a crack occurs in at least one of the second non-active area NA2, the boundary between the second non-active area NA2 and the first non-active area NA1, and the third non-active area NA3.

Further, to determine whether a crack occurs using the first detection transistor TS1 disposed in the first driving stage ST1, the worker may input the first detection signal S1 of high level to the first detection transistor TS1. Also, the worker may input a high-level signal to the first Q node Q1. In this case, if a clock signal is measured from the first crack detection terminal Sout1, it can be determined that no crack occurs in a region from the first crack detection terminal Sout1 to the gate link line GLL. That is, it can be determined that no crack occurs in the first non-active area NA1, the boundary between the first non-active area NA1 and the second non-active area NA2, the second non-active area NA2, the boundary between the second non-active area NA2 and the first non-active area NA1, and the third non-active area NA3.

On the other hand, if a clock signal is not measured from the first crack detection terminal Sout1, it can be determined that a crack occurs in the region from the first crack detection terminal Sout1 to the gate link line GLL. That is, it can be determined that a crack occurs in at least one of the first non-active area NA1, the boundary between the first non-active area NA1 and the second non-active area NA2, the second non-active area NA2, the boundary between the second non-active area NA2 and the first non-active area NA1, and the third non-active area NA3.

Further, if a clock signal is not measured from the first crack detection terminal Sout1 but a clock signal is measured from the first dummy crack detection terminal DSoutl, it can be determined that a crack occurs in at least one of the first non-active area NA1 and the boundary between the first non-active area NA1 and the second non-active area NA2.

Further, the worker can more precisely determine whether a crack occurs and a crack position by using the crack detection lines CL together with the above-described detection transistors DTS1, TS1 . . . TS(n), DTS2.

Specifically, the plurality of crack detection lines CL may include the fourth crack detection line CL4 disposed in the first non-active area NA1, the second non-active area NA2, and the third non-active area NA3. The plurality of crack detection lines CL may also include the fifth crack detection line CL5 disposed in the second non-active area NA2 and the third non-active area NA3 and the sixth crack detection line CL6 disposed in the third non-active area NA3. In this case, the fourth crack detection line CL4, the fifth crack detection line CL5, and the sixth crack detection line CL6 may be disposed in the non-active area NA on one side of the active area AA where the gate driving unit GD is disposed. Further, the fourth crack detection line CL4 may have a loop shape extended from one of the fourth crack detection pads CP4 to the other one of the fourth crack detection pads CP4 through the third non-active area NA3, the second non-active area NA2, the first non-active area NA1, the second non-active area NA2, and the third non-active area NA3. Furthermore, the fifth crack detection line CL5 may have a loop shape extended from one of the fifth crack detection pads CP5 to the other one of the fifth crack detection pads CP5 through the third non-active area NA3, the second non-active area NA2, and the third non-active area NA3. Also, the sixth crack detection line CL6 may have a loop shape extended from one of the sixth crack detection pads CP6 to the other one of the sixth crack detection pads CP6 through the third non-active area NA3. It is possible to determine whether a crack occurs and a crack position by using the fourth crack detection line CL4, the fifth crack detection line CL5, and the sixth crack detection line CL6 in the same manner as described above with reference to FIG. 6A and FIG. 6B. Therefore, redundant description thereof will not be provided. Although not illustrated in FIG. 8 and FIG. 9, the first crack detection line CL1, the second crack detection line CL2, and the third crack detection line CL3 described above with reference to FIG. 6A can also be applied.

In the display device 200 according to another embodiment of the present disclosure, the detection transistors DTS1, TS1 . . . TS(n), DTS2 are disposed in the plurality of stages DST1, ST1, ST2, ST(n−1), ST(n), DST2 of the gate driving unit GD. Thus, it is possible to determine whether a crack occurs and a crack position in the non-active area NA. That is, the detection transistors DTS1, TS1 . . . TS(n), DTS2 are formed disposed in the plurality of stages DST1, ST1, ST2, . . . ST(n−1), ST(n), DST2 of the gate driving unit GD at the same time as other transistors disposed in the plurality of stages DST1, ST1, ST2, ST(n−1), ST(n), DST2. Thus, it is possible to form the detection transistors DTS1, TS1 . . . TS(n), DTS2 without an additional process. Therefore, in the display device 200 according to another embodiment of the present disclosure, it is possible to perform crack detection through a more simplified process.

Further, the display device 200 according to another embodiment of the present disclosure uses the detection transistors DTS1, TS1 . . . TS(n), DTS2 disposed in the plurality of stages DST1, ST1, ST2, ST(n−1), ST(n), DST2 in the first non-active area NA1 where the encapsulation substrate 128 and the planarization layer 125 are disposed and the second non-active area NA2 where only the encapsulation substrate 128 among the encapsulation substrate 128 and the planarization layer 125 is disposed. Thus, it is possible to more easily and accurately determine whether a crack occurs and a crack position in the first non-active area NA1, the boundary between the first non-active area NA1 and the second non-active area NA2, and the second non-active area NA2.

<Connecting Transistors>

Figure 10:
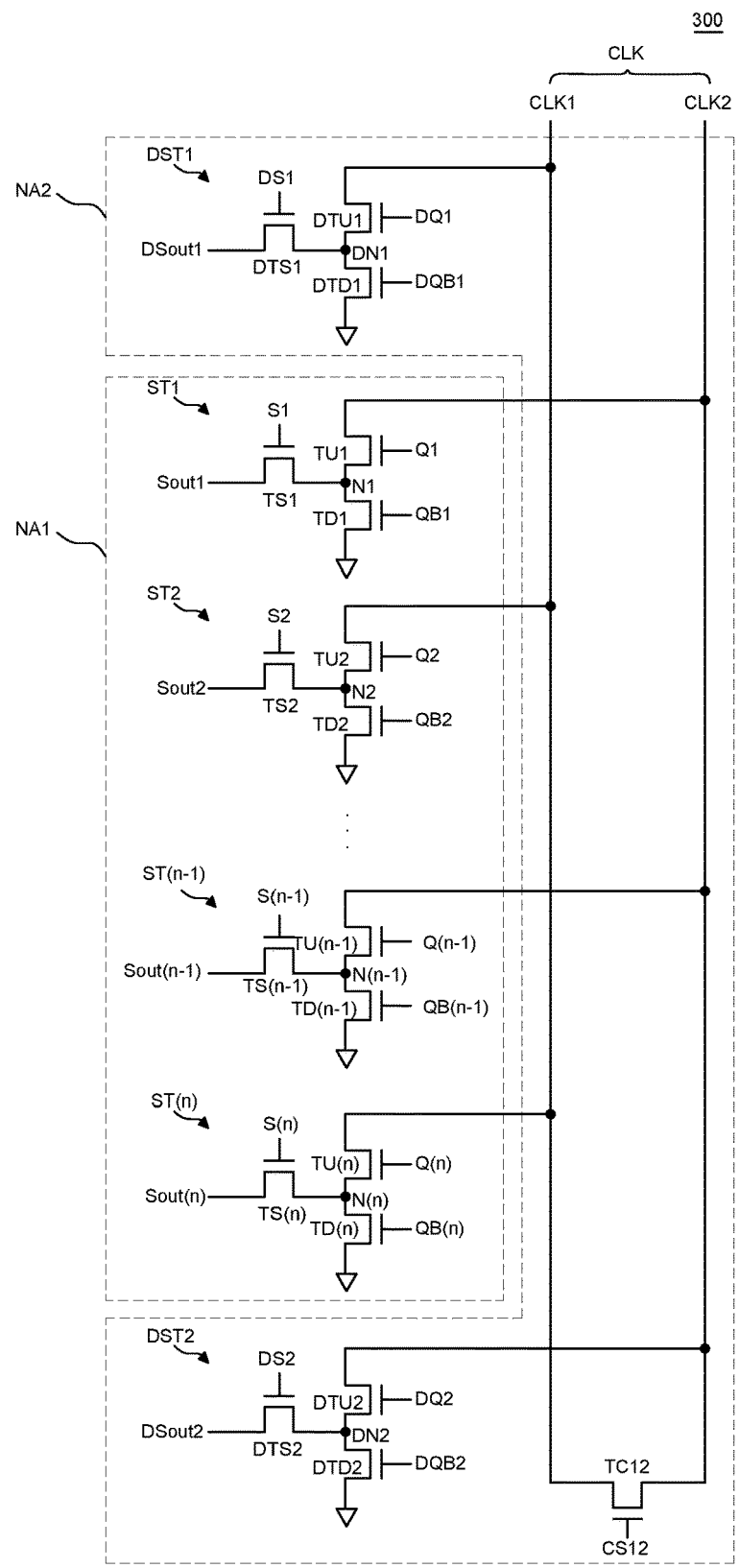
FIG. 10 is a circuit diagram provided to explain a display device according to yet another embodiment of the present disclosure.

FIG. 10 is a circuit diagram provided to explain a display device according to yet another embodiment of the present disclosure. A display device 300 illustrated in FIG. 10 has substantially the same configuration as the display device 200 illustrated in FIG. 8 and FIG. 9 except a clock line CLK and a connecting transistor TC12. Therefore, redundant description of the same components will not be provided.

Referring to FIG. 10, the clock line CLK includes a first clock line CLK1 and a second clock line CLK2.

The first clock line CLK1 may be connected to the first dummy stage DST1 and even-numbered driving stages and may transmit a first clock signal to the first dummy stage DST1 and the even-numbered driving stages. Further, the second clock line CLK2 may be connected to the second dummy stage DST2 and odd-numbered driving stages and may transmit a second clock signal to the second dummy stage DST2 and the odd-numbered driving stages. Herein, the first clock signal applied to the first clock line CLK1 and the second clock signal applied to the second clock line CLK2 may be identical to each other in amplitude and cycle but different from each other in phase.

Specifically, the first clock line CLK1 may be connected to the first dummy pull-up transistor DTU1 of the first dummy stage DST1 and a second pull-up transistor TU2 of the second driving stage ST2. Further, the second clock line CLK2 may be connected to the first pull-up transistor TU1 of the first driving stage ST1 and a second dummy pull-up transistor DTU2 of the second dummy stage DST2.

Referring to FIG. 10, the connecting transistor TC12 may connect the first clock line CLK1 and the second clock line CLK2.

The connecting transistor TC12 serves to connect the first clock line CLK1 and the second clock line CLK2 in response to a connection signal CS12. To this end, a gate electrode of the connecting transistor TC12 may be applied with the connection signal CS12. Also, a source electrode and a drain electrode of the connecting transistor TC12 may be connected to an end of the first clock line CLK1 and an end of the second clock line CLK2, respectively. Herein, the end of the first clock line CLK1 and the end of the second clock line CLK2 refer to ends disposed on the opposite side of connection points between the first and second clock lines CLK1 and CLK2 and the gate link line.

That is, if the connection signal CS12 has a high level, the connecting transistor TC12 is turned on and connects the first clock line CLK1 and the second clock line CLK2.

Hereafter, a method for detecting a crack will be described based on the first driving stage ST1 having the above-described connection structure in the display device 300 according to yet another embodiment of the present disclosure.

For example, a method for determining whether a crack occurs by using the first detection transistor TS1 disposed in the first driving stage ST1 when the worker applies the connection signal CS12 of low level is the same as the method described above with reference to FIG. 8 and FIG. 9.

Herein, the worker can apply the connection signal CS12 of high level and input the first detection signal S1 of high level to the first detection transistor TS1 and a high-level signal to the first Q node Q1. In this case, if the worker applies a first clock signal, it is possible to determine whether a crack occurs in the first driving stage ST1 and a part of the second clock line CLK2 connected to the first driving stage ST1 from the end of the first clock line CLK1 through the connecting transistor TC12.

That is, as described above, in the display device 300 according to yet another embodiment of the present disclosure, the plurality of clock lines CLK1 and CLK2 may be connected using the connecting transistor TC12. Thus, by connecting the plurality of clock lines CLK1 and CLK2 to each other, it is possible to detect whether a crack occurs in upper regions and lower regions of the clock lines CLK1 and CLK2, i.e., all the regions of the clock lines CLK1 and CLK2. Therefore, it is possible to more precisely determine whether a crack occurs and a crack position.

Figure 11:
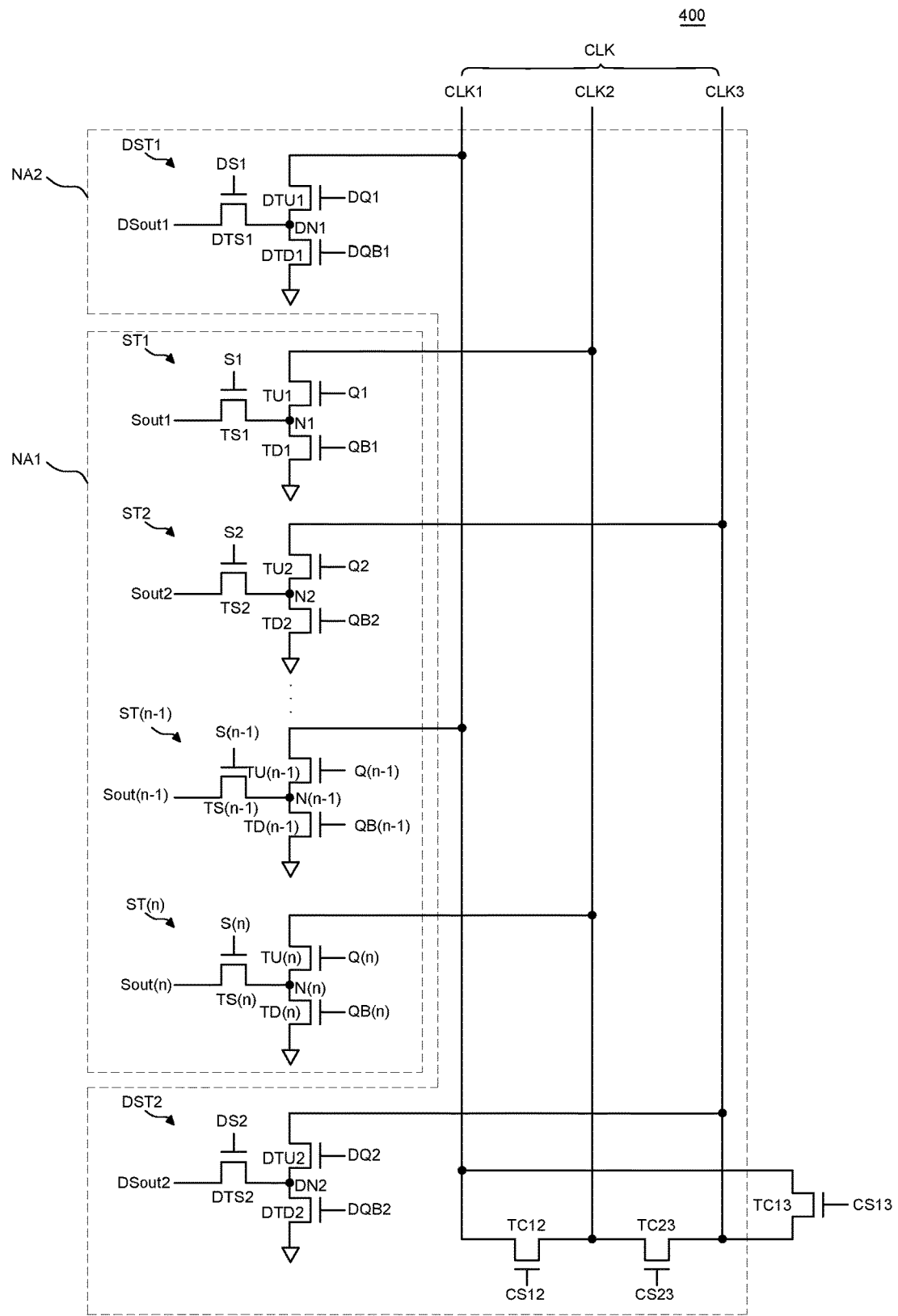
FIG. 11 is a circuit diagram provided to explain a display device according to still another embodiment of the present disclosure.

FIG. 11 is a circuit diagram provided to explain a display device according to still another embodiment of the present disclosure. A display device 400 illustrated in FIG. 11 has substantially the same configuration as the display device 300 illustrated in FIG. 10 except a clock line CLK and connecting transistors TC12, TC23, and TC13. Therefore, redundant description of the same components will not be provided.

Referring to FIG. 11, the clock line CLK includes the first clock line CLK1, the second clock line CLK2, and a third clock line CLK3.

The first clock line CLK1 may be connected to the first dummy pull-up transistor DTU1 of the first dummy stage DST1 and may transmit a first clock signal. Further, the second clock line CLK2 may be connected to the first pull-up transistor TU1 of the first driving stage ST1 and an nth pull-up transistor TU(n) of an nth driving stage ST(n) and may transmit a second clock signal. Furthermore, the third clock line CLK3 may be connected to the second pull-up transistor TU2 of the second driving stage ST2 and a second dummy pull-up transistor DTU2 of the second dummy stage DST2 and may transmit a third clock signal. That is, the first clock line CLK1, the second clock line CLK2, and the third clock line CLK3 may transmit clock signals in sequence to the three stages disposed in a consecutive manner. Herein, the first clock signal applied to the first clock line CLK1, the second clock signal applied to the second clock line CLK2, and the third clock signal applied to the third clock line CLK3 may be identical to each other in amplitude and cycle but different from each other in phase.

Referring to FIG. 11, the connecting transistor TC12 may connect the first clock line CLK1 and the second clock line CLK2, and the connecting transistor TC23 may connect the second clock line CLK2 and the third clock line CLK3. Also, the connecting transistor TC13 may connect the first clock line CLK1 and the third clock line CLK3.

The connecting transistor TC12 serves to connect the first clock line CLK1 and the second clock line CLK2 in response to the connection signal CS12. To this end, a gate electrode of the connecting transistor TC12 may be applied with the connection signal CS12. Also, a source electrode and a drain electrode of the connecting transistor TC12 may be connected to the end of the first clock line CLK1 and the end of the second clock line CLK2, respectively. Herein, the end of the first clock line CLK1 and the end of the second clock line CLK2 refer to ends disposed on the opposite side of connection points between the first and second clock lines CLK1 and CLK2 and the gate link line. That is, if the connection signal CS12 has a high level, the connecting transistor TC12 is turned on and connects the first clock line CLK1 and the second clock line CLK2.

Likewise, the connection transistor TC23 serves to connect the second clock line CLK2 and the third clock line CLK3 in response to a connection signal CS23. Also, the connecting transistor TC13 serves to connect the first clock line CLK1 and the third clock line CLK3 in response to a connection signal CS13.

Thus, in the display device 400 according to still another embodiment of the present disclosure, the plurality of clock lines CLK1, CLK2, and CLK3 can be connected in various ways by using the plurality of connecting transistors TC12, TC23, and TC13. Accordingly, by connecting the plurality of clock lines CLK1, CLK2, and CLK3 in various ways, the non-active area NA which is a target of crack detection can be set variously. Therefore, in the display device 400 according to still another embodiment of the present disclosure, it is possible to freely set a region of crack detection. Accordingly, it is possible to more precisely determine whether a crack occurs and a crack position.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A rollable display device comprising:
   a substrate including an active area that displays an image, a first non-active area extended from the active area that does not display the image, a second non-active area extended from the first non-active area that does not display the image, and a third non-active area extended from the second non-active area that does not display the image;
   a planarization layer disposed in the active area and the first non-active area without being disposed in the second non-active area and the third non-active area;
   a display element disposed on the planarization layer in the active area;
   an encapsulation substrate disposed on the display element in the active area, the first non-active area, and the second non-active area without being in the third non-active area; and
   a plurality of crack detection units disposed in at least one of the first non-active area, the second non-active area, or the third non-active area.

2. The rollable display device according to claim 1, wherein each of the plurality of crack detection units includes:
   a plurality of crack detection pads in the third non-active area, the plurality of crack detection pads including a first crack detection pad and a second crack detection pad; and
   a crack detection line including a first end and a second end, the first end connected to the first crack detection pad and the second end connected to the second crack detection pad,
   wherein the crack detection line is disposed in at least one of the first non-active area, the second non-active area, or the third non-active area.

3. The rollable display device according to claim 1, wherein the plurality of crack detection units includes:
   a first crack detection line disposed in the first non-active area, the second non-active area, and the third non-active area;
   a second crack detection line disposed in the second non-active area and the third non-active area without being disposed in the first non-active area; and
   a third crack detection line disposed in the third non-active area without being disposed in the first non-active area and the second non-active area.

4. The rollable display device according to claim 1, further comprising:
   a gate driving unit disposed in the first non-active area and the second non-active area; and
   a plurality of clock lines connected to the gate driving unit, the plurality of clock lines disposed in the second non-active area without being disposed in the first non-active area and the third non-active area,
   wherein the plurality of crack detection units are electrically connected to the gate driving unit.

5. The rollable display device according to claim 4, wherein the gate driving unit includes a plurality of stages, and each of the plurality of crack detection units is connected to an output terminal of a corresponding one of the plurality of stages.

6. The rollable display device according to claim 5, wherein the plurality of stages includes a first stage and a second stage, the first stage disposed on a first side of a boundary between the first non-active area and the second non-active area, and the second stage disposed on a second side of the boundary between the first non-active area and the second non-active area.

7. The rollable display device according to claim 6, wherein the first stage is a dummy stage that is not connected to one of a plurality of gate lines of the rollable display device, and
   the second stage is a driving stage that is connected to one of the plurality of gate lines of the rollable display device.

8. The rollable display device according to claim 5, wherein each of the plurality of stages includes:
   a pull-up transistor that outputs a clock signal to an output terminal of the stage according to a voltage of a Q node; and
   a pull-down transistor connected to the pull-up transistor, the pull-down transistor outputting a low-potential voltage to the output terminal according to a voltage of a QB node, and
   each of the plurality of crack detection units is connected to the output terminal of a corresponding one of the plurality of stages.

9. The rollable display device according to claim 4, further comprising:
   one or more connecting transistors connected to ends of two clock lines from the plurality of clock lines.

10. The rollable display device according to claim 1, further comprising:
    a printed circuit board; and
    a plurality of crack detection pads disposed in the third non-active area or in the printed circuit board, the plurality of crack detection pads connected to the plurality of crack detection units.

11. A display device comprising:
    a substrate including an active area that displays an image, a first non-active area surrounding the active area, a second non-active area surrounding the first non-active area, and a third non-active area surrounding the second non-active area;
a planarization layer disposed on the substrate in the active area and the first non-active area without being disposed in the second non-active area and the third non-active area;
a display element disposed on the planarization layer in the active area;
an encapsulation substrate disposed on the display element, the encapsulation substrate in the active area, the first non-active area, and the second non-active area without being in the third non-active area;
a roller unit configured to wind or unwind the substrate; and
a plurality of crack detection units disposed on the substrate, the plurality of crack detection units configured to detect whether a crack occurs in at least one of the first non-active area, the second non-active area, or the third non-active area.

12. The display device according to claim 11, wherein the plurality of crack detection units include:
a first crack detection unit configured to detect whether a crack occurs in any one of the first non-active area, a boundary between the first non-active area and the second non-active area, the second non-active area, a boundary between the second non-active area and the third non-active area, or the third non-active area;
a second crack detection unit configured to detect whether a crack occurs in any one of the second non-active area, the boundary between the second non-active area and the third non-active area, or the third non-active area, but not in the first non-active area and the boundary between the first non-active area and the second non-active area; and
a third crack detection unit configured to detect whether a crack occurs in the third non-active area, but not in the first non-active area, the boundary between the first non-active area and the second non-active area, the second non-active area, and the boundary between the second non-active area and the third non-active area.

13. The display device according to claim 12,
wherein the first crack detection unit includes a first crack detection loop disposed across the boundary between the first non-active area and the second non-active area, and the boundary between the second non-active area and the third non-active area,
the second crack detection unit includes a second crack detection loop disposed across the boundary between the second non-active area and the third non-active area without being disposed in the first non-active area, and
the third crack detection unit includes a third crack detection loop disposed in the third non-active area without being disposed in the first non-active area and the second non-active area.

14. The display device according to claim 11, further comprising:
a gate driving unit overlapping a boundary between the first non-active area and the second non-active area; and
a plurality of clock lines disposed in the second non-active area without being disposed in the first non-active area and the third non-active area, the plurality of clock lines connected to the gate driving unit,
wherein the plurality of crack detection units are electrically connected to the gate driving unit.

15. The display device according to claim 14,
wherein the gate driving unit includes a plurality of driving stages that are connected to gate lines of the display device and a plurality of dummy stages that are not connected to the gate lines of the display device, the plurality of driving stages disposed in the first non-active area and the plurality of dummy stages disposed in the second non-active area, and
the plurality of crack detection units are connected to output terminals of the plurality of driving stages and the plurality of dummy stages.

16. The display device according to claim 15,
wherein each of the plurality of dummy stages and the plurality of driving stages includes a pull-up transistor and a pull-down transistor connected to the pull-up transistor, the pull-up transistor and the pull-down transistor control voltages of the output terminals, and
each of the plurality of crack detection units including a detection transistor having a gate electrode, a source electrode, and a drain electrode, wherein the gate electrode is connected to a detection signal line, and the source electrode or the drain electrode is connected to a corresponding one of the output terminals.

17. The display device according to claim 14, further comprising:
a connecting transistor that connects ends of the plurality of clock lines in response to a connection signal.

18. A flexible display device comprising:
a substrate including an active area that displays an image, a first non-active area extended from the active area that does not display the image, a second non-active area extended from the first non-active area that does not display the image, and a third non-active area extended from the second non-active area that does not display the image;
a display element configured to display an image in the active area, the display element disposed in the active area without being disposed in the first non-active area, the second non-active area, and the third non-active area;
a plurality of crack detection pads including a first crack detection pad and a second crack detection pad, the first crack detection pad and the second crack detection pad disposed in the third non-active area without being disposed in the active area, the second non-active area, and the third non-active area; and
a first crack detection line having a first end and a second end, the first end connected to the first crack detection pad and the second end connected to the second crack detection pad, the first crack detection line disposed across at least one of the third non-active area, the second non-active area, or the third non-active area.

19. The flexible display device of claim 18, wherein the first crack detection line is disposed across the third non-active area, the second non-active area, and the first non-active area.

20. The flexible display device of claim 19, wherein the plurality of crack detection pads further includes a third crack detection pad, a fourth crack detection pad, a fifth crack detection pad, and a sixth crack detection pad, the flexible display device further comprising:
a second crack detection line disposed across the third non-active area and the second non-active area without being disposed in the first non-active area, the second crack detection line including a first end connected to the third crack detection pad and a second end connected to the fourth crack detection pad; and a third crack detection line disposed across the third non-active area without being disposed in the first non-active area and the second non-active area, the third crack detection line including a first end connected to the fifth crack detection pad and a second end connected to the fifth crack detection pad.

21. The flexible display device according to claim 18, further comprising:
   a gate driving unit overlapping a boundary between the first non-active area and the second non-active area; and
   a plurality of clock lines disposed in the second non-active area without being disposed in the first non-active area and the third non-active area, the plurality of clock lines connected to the gate driving unit,
   wherein the gate driving unit includes a plurality of driving stages that are connected to gate lines of the flexible display device and a plurality of dummy stages that are not connected to the gate lines of the flexible display device, the plurality of driving stages disposed in the first non-active area and the plurality of dummy stages disposed in the second non-active area.

22. The flexible display device of claim 21, wherein each of the plurality of dummy stages and the plurality of driving stages includes a pull-up transistor connected to one of the plurality of clock lines, a pull-down transistor connected to the pull-up transistor, and a detection transistor having a gate electrode, a source electrode, and a drain electrode,
   wherein the gate electrode is connected to a detection signal line, and the source electrode or the drain electrode is connected to a corresponding output terminal of the respective stage, the output terminal located at a connection between the pull-up transistor and the pull-down transistor.

* * * * *